United States Patent [19]

Katsuragawa et al.

[11] Patent Number: 5,907,586
[45] Date of Patent: May 25, 1999

[54] METHOD AND DEVICE FOR SIGNAL DECISION, RECEIVER AND CHANNEL CONDITION ESTIMATING METHOD FOR A CODING COMMUNICATION SYSTEM

[75] Inventors: Hiroshi Katsuragawa; Shigeru Ono, both of Tokyo, Japan

[73] Assignee: Oki Electric Industry Co., Ltd., Tokyo, Japan

[21] Appl. No.: 08/704,475

[22] Filed: Aug. 27, 1996

[30] Foreign Application Priority Data

Sep. 4, 1995 [JP] Japan .................................. 7-226536

[51] Int. Cl.$^6$ ............................ H03D 1/00; H04L 23/02; H04B 7/216; G06F 11/10
[52] U.S. Cl. ...................... 375/341; 375/265; 375/262; 370/342; 370/395; 371/43.4; 371/43.7
[58] Field of Search .................................. 375/341, 265, 375/262; 370/342, 395, 538; 371/43.4, 43.7, 43.2

[56] References Cited

U.S. PATENT DOCUMENTS

| | | | |
|---|---|---|---|
| 5,272,727 | 12/1993 | Okanoue | 375/341 |
| 5,414,738 | 5/1995 | Bienz | 373/341 |
| 5,432,820 | 7/1995 | Sugawara et al. | 374/341 |
| 5,440,588 | 8/1995 | Murakami | 375/341 |
| 5,509,020 | 4/1996 | Iwakiri et al. | 375/341 |
| 5,566,206 | 10/1996 | Butler et al. | 375/225 |
| 5,621,764 | 4/1997 | Ushirokawa et al. | 375/317 |
| 5,684,832 | 11/1997 | Adachi et al. | 375/262 |
| 5,724,394 | 3/1998 | Ikeda et al. | 375/341 |

FOREIGN PATENT DOCUMENTS

| | | |
|---|---|---|
| 0 152 947 | 8/1985 | European Pat. Off. . |
| 0 448 809 | 10/1991 | European Pat. Off. . |
| WO 95/08888 | 6/1995 | WIPO . |

OTHER PUBLICATIONS

"TIA/EIA/IS–54B Cellular System Dual–Mode Mobile Station —Base Station Compatibility Standard", section 2.4.5.4.1.1 Bit Error Rate (BER) Measurement Technique, p. 103.

"TIA/EIA/IS–95 Mobile Station —Base Station compatability Standard for Dual Mode Wideband Spread Spectrum Cellular System", section 7.1.3.5.2 Forward Traffic Channel Structure, pp. 7–27 thru 7–38.

"Hideki Imai Code Theory", the Institute of Electronics, Information and Communication Engineers of Japan, Section 5.3 Error Detection by Cyclic Code, pp. 118–120.

"Q0256 K–7 Multi–code rate Viterbi decoder Technical data sheet", Fig. 9. "Re–encode and compare circuit", pp. 3–13.

"A Viterbi Algorithm with Soft–Decision Outputs and its Applications", J. Hagenauer et al, Globecom–89, pp. 1680–1686.

*Primary Examiner*—Chi H. Pham
*Assistant Examiner*—Khai Tran
*Attorney, Agent, or Firm*—Venable; Robert J. Frank; Allen Wood

[57] ABSTRACT

A method and a device for signal decision, a receiver and a channel condition estimating method for a coding communication system are disclosed. A plurality of add, compare and select (ACS) circuits each sequentially determines metrics at a particular trellis tracing rate assigned thereto. The metrics are sequentially added in order to select the most probable path. An M break-up circuit 30 compares the path metrics of the most probable paths and breaks up unlikely paths over a plurality of circuits. The path metrics of probable paths are sequentially written to respective metric memories and again fed to the ACS circuits for trellis tracings. This is repeated until the M break-up circuit 30 selects M paths out of paths fed from N (N>M) ACS circuits. The M paths are delivered to a decision circuit while survivor paths are written to respective path memories. The decision circuit selects one of the M path metrics having the smallest value, reads the path out of the path memory, traces it back, and then outputs decoded bits via an output terminal.

57 Claims, 20 Drawing Sheets

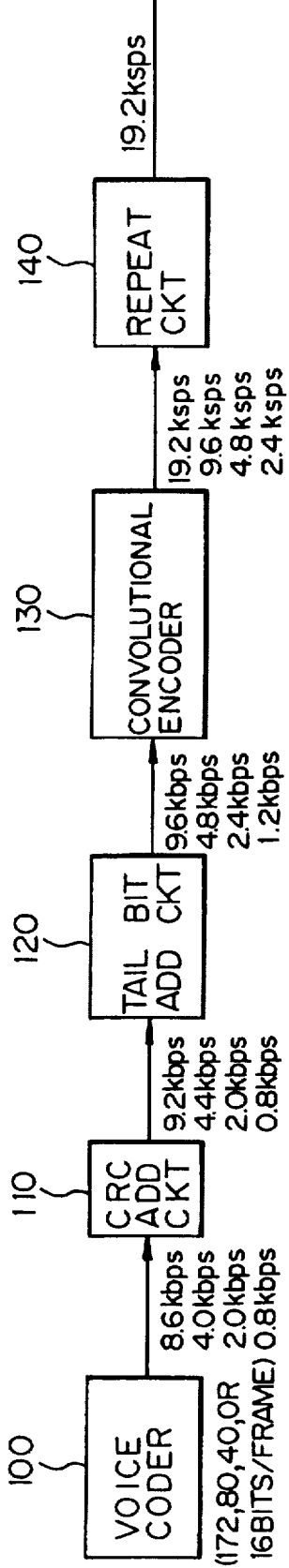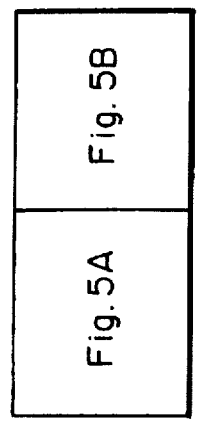

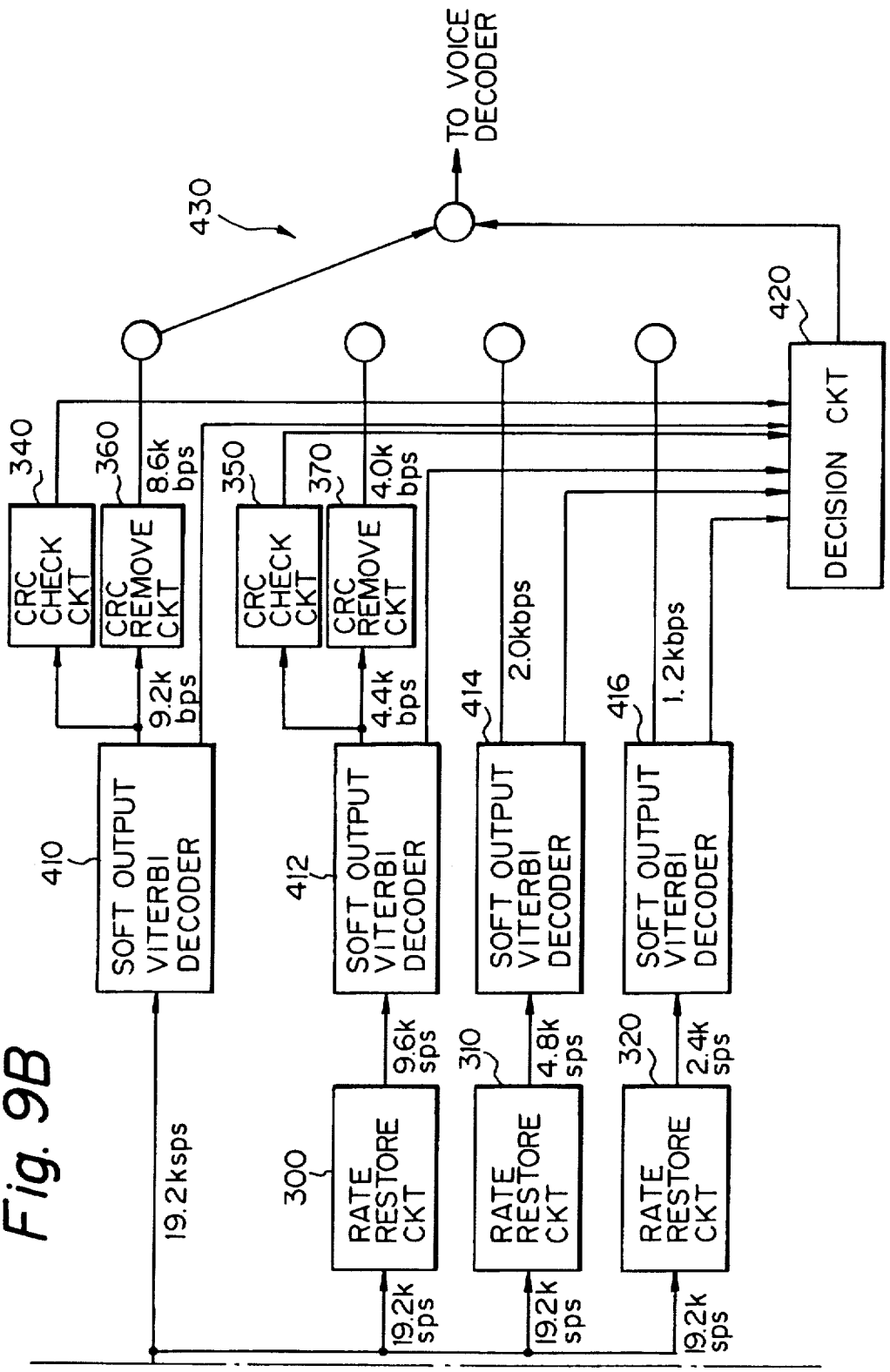

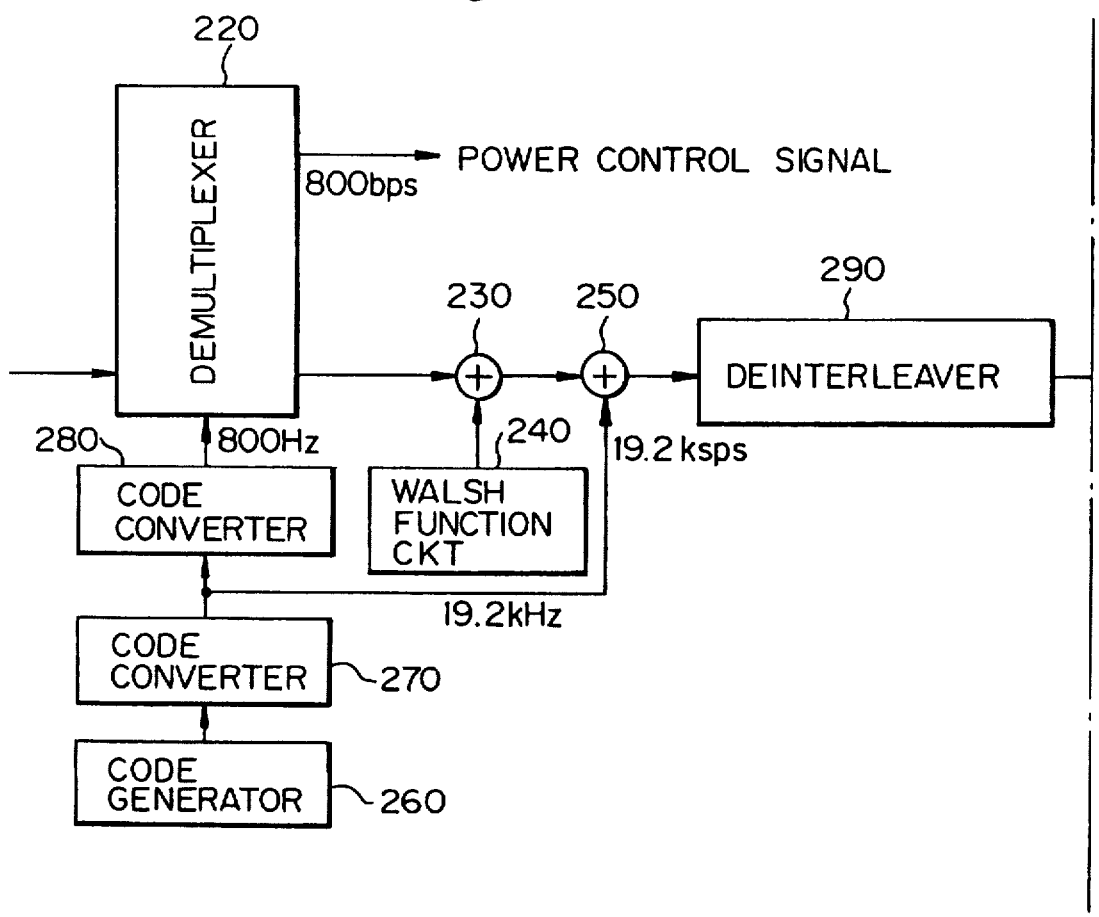

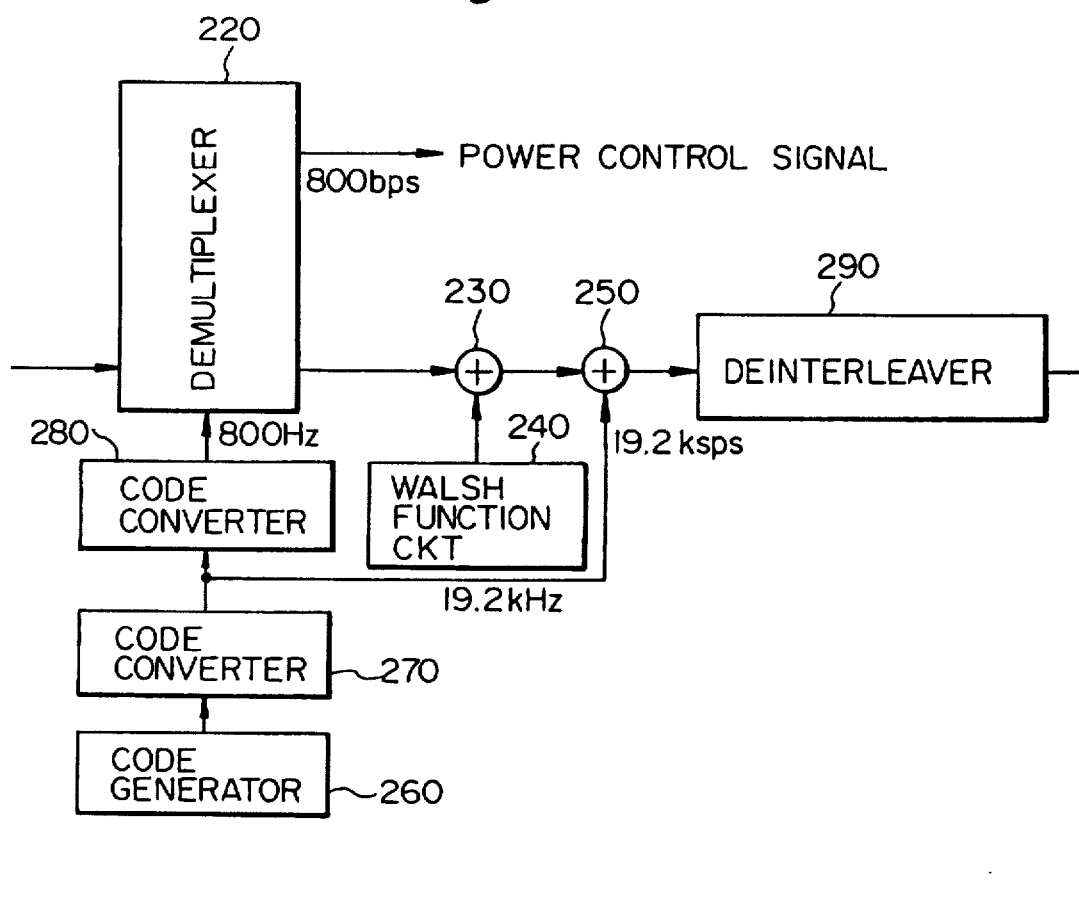
Fig. 16A
Fig. 16
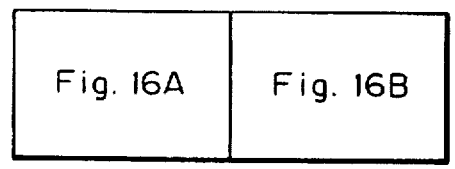

METHOD AND DEVICE FOR SIGNAL DECISION, RECEIVER AND CHANNEL CONDITION ESTIMATING METHOD FOR A CODING COMMUNICATION SYSTEM

BACKGROUND OF THE INVENTION

1. Field of the Invention

The present invention relates to a method and a device for signal decision, a receiver and a channel condition estimating method for a coding communication system. More Particularly, the present invention relates to a method and a device for signal decision, a receiver and a channel condition estimating method for a coding communication system which are feasible for mobile communication using, e.g., a digital handy phone or mobile phone.

2. Description of the Background Art

Recently, due to the spreading mobile communication environment, digital handy phones and mobile phones promoting the efficient use of limited frequencies have been standardized in various countries. In the USA, for example, a North American TDMA (Time Division Multiple Access) handy phone system (IS-54) and other TDMA handy phone systems have been standardized first, and then followed by a North American CDMA (Code Division Multiple Access) digital cellular system (IS-95) and other CDMA handy phone systems.

In the North American TDMA digital cellular system, a signal lying in the speech band is transformed to a code by a voice coding method called VSELP (Vector Sum Excited Linear Prediction). The code is converted to an error correcting code by, e.g., a convolutional code, CRC (Cyclic Redundancy Check) code, and interslot interleave. A synchronizing signal and control signals are added to the error correcting code in the format of a TDMA slot. Particularly, a speech signal and an FACCH (Fast Associated Control Channel) signal included in the control signals and used to switch cells are each encoded by a convolutional encoder having a particular code rate. For example, speech data and FACCH are encoded by a rate ½ and a rate ¼ convolutional encoder, respectively. The resulting convolutional codes are selectively arranged in the data field of the same slot. The data constructed into a slot are transformed to preselected symbols by a modulating section using a π/4 shift DQPSK (Differentially Encoded Quadrature Phase Shift Keying) or similar scheme. The symbols are modulated by orthogonal modulation or similar modulation, superposed on a carrier of preselected frequency, and then transmitted.

On receiving a signal from a mobile station, a base station multiplexes it with slots received from other mobile stations at a full rate over up to three channels. Then, the base station transmits the multiplexed slots to the mobile stations as a frame signal.

Each mobile station removes the carrier from the received signal and demodulates the channel assigned thereto by, e.g., orthogonal detection, thereby detecting received baseband symbols. Noise contained in the received symbols due to fading and other causes is cancelled by, e.g., an equalizer. Then, the original slot signal is restored by differential logic decoding. The restored slots each including the speech data or the control signals are decomposed into independent signals. These signals are each output to either a control section or voice decoding section. As a result, the reproduction of the speech data, position control and other functions assigned to the mobile station are executed.

On the other hand, in the North American CDMA digital cellular system, a signal lying in the speech band is encoded to speech data by, e.g., variable rate speech encoding called QCELP (Qualcomm Codebook Excited Linear Prediction). This speech coding scheme changes the transmission rate in accordance with the ratio of the duration of a speech. For example, for a 20 millisecond frame format, speech data are encoded at code rates of sixteen bits (0.8 kilobits per second or kbps), forty bits (2.0 kbps), eighty bits (4.0 kbps) and 172 bits (8.6 kbps). CRC codes are added only to the speech data encoded at the rates of 8.6 kbps and 4.0 kbps, thereby producing a 9.2 kbps code and a 4.4 kbps code. Further, tail bits are added to all the encoded speech data in order to cause them to converge to the same condition when decoded. As a result, there are produced 9.6 kbps, 4.8 kbps, 2.4 kbps and 1.2 kbps codes. The signals with the tail bits are each constructed into a symbol by convolutional coding and then caused to recur in accordance with the respective code rate. Consequently, the symbols are provided with a uniform symbol rate, e.g., 19.2 kbps. Further, these signals are subjected to interleaving in order to form respective frames. The frames are each subjected to spread coding by false noise and then subjected to orthogonal transformation using, e.g., a Walsh function. The transformed signals are divided into two phases and subjected to spectrum spreading by OQPSK (Offset Quadrature Phase Shift Keying) modulation using a short PN code or similar pilot false random number sequence. The resulting signals are individually superposed on a carrier and then transmitted.

A base station having received a signal from a mobile station multiplexes it with signals received from other mobile stations in the same frequency band over up to fifty-five channels.

On receiving the OQPSK signal from the base station, the mobile station demodulates it to output a baseband signal. The demodulated baseband signal is reconstructed into the original signals by, e.g., a rake receiver circuit called a finger circuit and effecting synchronization to the pilot false random number sequence, frequency synchronization, and inverse spreading. The reconstructed symbols are deinterleaved and then decoded by Viterbi decoding. At this instant, the signals each having a particular rate are re-encoded and then compared with the original received signal for a decision purpose. The signal coincident with the original received signal is determined to have the rate of the signal. This signal is subjected to error correction and transformed to the original speech data by a voice decoder or vocoder.

The conventional systems described above have some issues yet to be solved, as follows. In the North American TDMA digital cellular system, information for distinguishing the speech data and the control signals or FACCH signal is not added. This requires the receiver side to determine whether a received signal is speech data or whether it contains FACCH. Also, in the North American CDMA digital cellular system using a variable rate vocoder, information for identifying the code rate is not sent to the receiver side. The receiver side therefore must identify the rate of a received signal.

In any case, the receiver side initially executes channel decoding (error correction) corresponding to the encoder of the channel with all the possible signals. Each decoder calculates the reliability of the respective result of decoding, i.e., estimates channel conditions. Among a plurality of decoders included in the receiver side, the decoders not matching the encoder used at the transmitter side cannot decode the signal correctly. Indexes representative of channel conditions and output from the channel condition estimator of each decoder are expected to have a distribution differing from the decoder matching the encoder to the decoder not matching it. The receiver estimates the signal encoded at the transmitter side by using the above difference.

Under these circumstances, signal decision executing the above identification is significant with the receiver. Incorrect signal decision has a critical influence on the performance of the entire communication system. For accurate signal decision, an implementation for estimating channel conditions which are the key to the decision is essential. For example, a CRC code or similar error correcting code or a known code sequence shared by the transmitter and receiver constitutes an overhead against information to be interchanged. For example, in the North American CDMA digital cellular system, as for the 8.6 kbps and 4.0 kbps codes, a twelve-bit and an eight-bit CRC error detecting code are added to an eighty-bit information source code. These two error detecting bits can be used to estimate channel conditions. However, the 2.0 kbps and 0.8 kbps codes are not provided with any error detecting code. Moreover, because channel condition estimation using any of the above schemes includes the specifications of an encoder, it cannot be added to a communication system whose specifications have already been established.

Technologies relating to the present invention are disclosed in the following documents:

(1) "TIA/EIA/IS-54B Cellular System Mobile Station—Base Station Compatibility Standard", section 2.4.5.4.1.1 Bit Error Rate (BER) Measurement Technique;

(2) "TIA/EIA/IS-95 Mobile Station—Base Station Compatibility Standard for Dual Mode Wideband Spread Spectrum Cellular System", section 7.1.3.5.2 Forward Traffic Channel Structure;

(3) Hideki Imai "Code Theory", the Institute of Electronics, Information and Communication Engineers of Japan, section 5.3 Error Detection by Cyclic Code;

(4) "Q0256 K=7 Multi-code rate Viterbi decoder Technical data sheet", FIG. 9, "Re-encode and compare circuit"; and (5) "A Viterbi algorithm with soft-decision outputs and its applications", J. Hagenauer, P. Hoeher, GLOBECOM-89, pp. 1680–1686.

SUMMARY OF THE INVENTION

It is therefore an object of the present invention to provide a method and a device for signal decision and a receiver for a coding communication system and capable of reproducing signals each having a particular code rate while distinguishing them accurately without resorting to any change in the configuration of the transmitter side.

It is another object of the present invention to provide a signal deciding method and a channel condition estimating method capable of reducing the error frequency of signal decision with more accurate indexes for channel condition estimation than conventional indexes implemented by CRC codes or similar error correcting codes.

In accordance with the present invention, a signal decision device for a coding communication system and for identifying the code rate of a received signal encoded at any one of a plurality of code rates including a convolutional code rate has a plurality of Viterbi decoders for respectively performing trellis tracings with the received signal in accordance with the plurality of code rates to thereby output a plurality of decoded signals each having a particular rate. An M break-off circuit sequentially receives a plurality of path metrics sequentially detected by the plurality of Viterbi decoders during the trellis tracings, and sequentially breaks off the trellis tracings of, among the plurality of paths, unlikely paths to thereby detect M most probable paths over at least two of the plurality of Viterbi decoders. A decision circuit performs the final decision with the path metrics of the M paths to thereby determine which of the decoded signals output from the plurality of Viterbi decoders has a correct code rate.

In accordance with the present invention, a signal decision device for a coding communication system and for identifying the code rate of a received signal encoded at any one of a plurality of code rates including a convolutional code rate has a plurality of soft output Viterbi decoders for respectively performing trellis tracings with the received signal in accordance with the plurality of code rate to thereby decode the received signal to a plurality of signals each having a particular rate, and outputs together with the plurality of signals reliability information representative of the likelihood of the plurality of signals. A decision circuit determines, based on the reliability information received from the plurality of soft output Viterbi decoders, which of the plurality of signals is correct.

In accordance with the present invention, a signal decision device for a coding communication system and for identifying the code rate of a received signal encoded at any one of a plurality of code rates including a convolutional code rate has a plurality of Viterbi decoders for respectively performing trellis tracings with the received signal in accordance with the plurality of code rates to thereby decode the received signal to a plurality of signals each having a particular rate. A decision circuit receives path metrics of the last stage of survivor paths surviving after the trellis tracings performed by the plurality of Viterbi decoders, and estimates channel conditions based on the path metrics to thereby determine which of the plurality of signals output from the plurality of Viterbi decoders is correct.

In accordance with the present invention, a signal decision device for a coding communication system and for identifying the code rate of a received signal encoded at any one of a plurality of code rates including a convolutional code rate, has a plurality of Viterbi decoders for respectively performing trellis tracings with the received signal in accordance with the plurality of code rates to thereby decode the received signal to a plurality of signals each having a particular rate. A plurality of re-encoders are provided for respectively re-encoding the plurality of signals output from the plurality of Viterbi decoders to corresponding convolutional codes. A plurality of decision circuits respectively produce signal decisions based on the convolutional codes output from the plurality of re-encoders and the received signal. The plurality of decision circuits respectively receive re-encoded symbol sequences from the plurality of re-encoders and a received symbol sequence input to the plurality of Viterbi decoders, multiply the re-encoded symbol sequences by a constant to produce products, produce differences between the products and the received symbol sequence, square the differences to produce squares, totalize the squares to produce totals, determine a smallest total, and estimate channel conditions based on the smallest total to thereby determine which of the plurality of signals output from the plurality of Viterbi decoders is correct.

In accordance with the present invention, a signal deciding method for a coding communication system and for identifying the code rate of a received signal encoded at any one of a plurality of code rates including a convolutional code rate has a step of (a) performing trellis tracings with the received signal in accordance with the plurality of code rates to thereby decode the received signal to a plurality of signals each having a particular code rate. The step (a) is followed by a step of (b) sequentially receiving a plurality of path metrics sequentially detected by the trellis tracings in the step (a), and straentially breaking off the trellis tracings of, among the plurality of paths, unlikely paths to thereby detect M most probable paths over at least two of the trellis tracings. The step (b) is followed by a step of (c) executing a final decision with the path metrics of the M paths detected in the step (b) to thereby identify the code rate of the received signal.

In accordance with the present invention, a signal deciding method for a coding communication system and for identifying the code rate of a received signal encoded at any one of a plurality of code rates including a convolutional code rate has a step of (a) executing trellis tracings each corresponding to one of the plurality of code rates to thereby decode the received signal to a plurality of signals each having a particular code rate, and outputting reliability information each being representative of a probability of the signal. The step (a) is followed by a step of (b) determining, based on the reliability information, which of the signals output in the step (a) is correct.

In accordance with the present invention, a channel condition estimating method for estimating, in the event of identification of the code rate of a received signal encoded at any one of a plurality of code rates including a convolutional code rate, channel conditions for thereby performing a signal decision has a step of (a) executing trellis tracings each corresponding to one of the plurality of code rates to thereby decode the received signal to a plurality of signals each having a particular code rate. The step (a) is followed by a step of (b) detecting the path metrics of last stages of paths surviving after the trellis tracings. The step (b) is followed by a step of (c) determining error probabilities of the plurality of signals output in the step (a) by using the path metrics as indexes to thereby estimate channel conditions.

In accordance with the present invention, a channel condition estimating method for estimating, in the event of identification of the code rate of a received signal encoded at any one of a plurality of code rates including a convolutional code rate, channel conditions for thereby executing a signal decision has a step of (a) executing trellis tracings each corresponding to one of the plurality of code rates to thereby decode the received signal to a plurality of signals each having a particular rate. The step is followed by a step of (b) re-encoding the plurality of signals produced in the step (a) to output corresponding convolutional codes. The step (b) is followed by a step of (c) executing a signal decision on the basis of the convolutional codes produced in the step (b) and the received signal. The step (c) consists in multiplying the symbol sequences of the convolutional codes output in the step (b) by a constant to produce products, producing differences between the products and the symbol sequence of the received signal, squaring the differences to produce squares, totalizing the squares to produce totals, determining the smallest total, and determining error probabilities of the convolutional codes on the basis of the smallest total to thereby estimate channel conditions.

In accordance with the present invention, a receiver for a coding communication and for identifying the code rate of a received signal encoded at any one of a plurality of code rates including a convolutional code rate has a plurality of Viterbi decoders for respectively performing trellis tracings with the received signal in accordance with the plurality of code rates to thereby decode the received signal to a plurality of signals each having a particular rate. An M break-off circuit sequentially receives a plurality of path metrics sequentially detected by the plurality of Viterbi decoders during the trellis tracings, and sequentially breaks off the trellis tracings of, among the plurality of paths, unlikely paths to thereby detect M most probable paths over at least two of the plurality of Viterbi decoders. A decision circuit executes the final decision with the path metrics of the M paths, and traces back a path corresponding to the result of the final decision to thereby output decoded bits.

In accordance with the present invention, a receiver for a coding communication system and for identifying the code rate of a received signal encoded at any one of a plurality of code rates including a convolutional code rate has a plurality of soft output Viterbi decoders for respectively performing trellis tracings with the received signal in accordance with the plurality of code rates to thereby decode the received signal to a plurality of signals each having a particular rate, and outputs together with the plurality of signals reliability information representative of the likelihood of the plurality of signals. A decision circuit determines, based on the reliability information received from the plurality of soft output Viterbi decoders, which of the plurality of signals is correct. A selecting circuit selects one of the plurality of signals on the basis of the result of decision of the decision circuit.

In accordance with the present invention, a receiver for a coding communication system and for identifying the code rate of a received signal encoded at any one of a plurality of code rates including a convolutional code rate has a plurality of Viterbi decoders for respectively performing trellis tracings with the received signal in accordance with the plurality of code rates to thereby decode the received signal to a plurality of signals each having a particular rate. A decision circuit receives path metrics of the last stages of paths surviving after the trellis tracings performed by the plurality of Viterbi decoders, and estimates channel conditions based on the path metrics to thereby determine which of the the plurality of signals output from the plurality of Viterbi decoders is correct. A selecting circuit selects one of the plurality of signals on the basis of a result of the decision of the decision circuit.

In accordance with the present invention, a signal decision device for a coding communication system and for identifying the code rate of a received signal encoded at any one of a plurality of code rates including a convolutional code rate has a plurality of Viterbi decoders for respectively performing trellis tracings with the received signal in accordance with the plurality of code rates to thereby decode the received signal to a plurality of signals each having a particular rate. A plurality of re-encoders respectively re-encode the plurality of signals output from the plurality of Viterbi decoders to corresponding convolutional codes. A plurality of decision circuits are provided for respectively performing signal decisions on the basis of the convolutional codes output from the plurality of re-encoders and the received signal. A selecting circuit selects one of the plurality of signals output from the plurality of Viterbi decoders on the basis of the results of decisions of the plurality of decision circuits. The plurality of decision circuits respectively receive re-encoded symbol sequences from the respective re-encoders and a received symbol sequence input to the respective Viterbi decoders, multiply the re-encoded symbol sequences by a constant to produce products, produce differences between the products and the received symbol sequence, square the differences to produce squares, totalize the squares to produce totals, determine a smallest total, and estimate channel conditions based on the smallest total to thereby determine which of the plurality of signals output from the plurality of Viterbi decoders is correct.

BRIEF DESCRIPTION OF THE DRAWINGS

The objects and features of the present invention will become more apparent from a consideration of the following detailed description taken in conjunction with the accompanying drawings in which:

FIGS. 4A and 4B are block diagrams schematically showing a receiver to which the embodiment is applied;

FIG. 5 shows how FIGS. 5A and 5B are combined;

FIGS. 5A and 5B are block diagrams schematically showing a transmitter for use with the receiver shown in FIGS. 4A and 4B;

FIGS. 9A and 9B are combined;

FIGS. 9A and 9B are block diagrams schematically showing a receiver to which the embodiment of FIG. 6 is applied;

FIG. 13 shows how FIGS. 13A and 13B are combined;

FIGS. 13A and 13B are block diagrams schematically showing a receiver to which the embodiment of FIG. 10 is applied;

FIG. 16 shows how FIGS. 16A and 16B are combined;

FIGS. 16A and 16B are block diagrams schematically showing a receiver to which the embodiment of FIG. 14 is applied.

DESCRIPTION OF THE PREFERRED EMBODIMENTS

Figure 1:
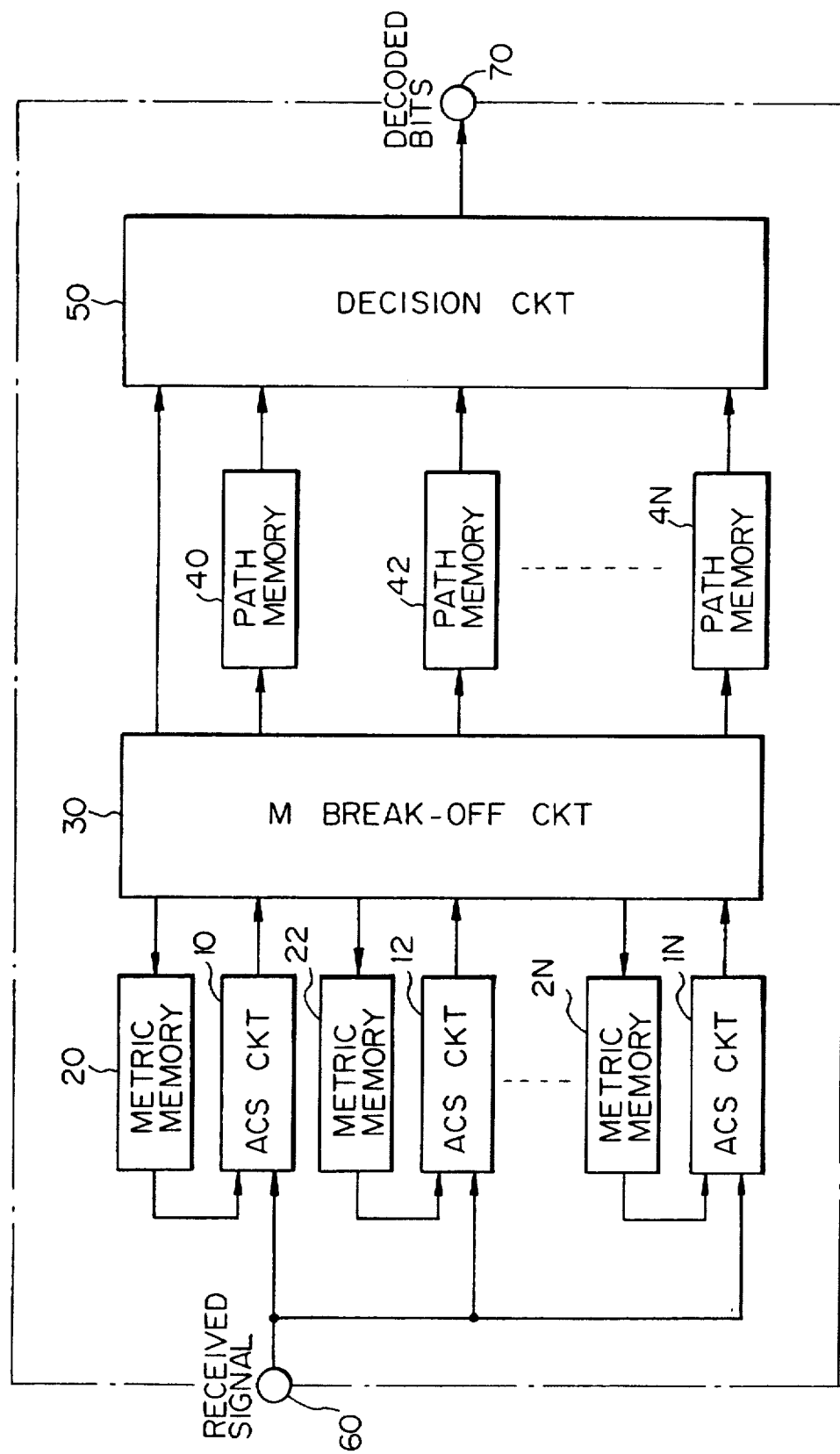
FIG. 1 is a block diagram schematically showing a signal decision device for a coding communication system and embodying the present invention.

Referring to FIG. 1 of the drawings, a signal decision device for a coding communication system and embodying the present invention is shown. The device to be described may advantageously be applied to a receiver section built in a TDMA, CDMA or similar digital handy phone. Particularly, the device is suitable for a decoding circuit of the type receiving a signal encoded by any one of a plurality og codes each having a particular code rate and including a convolutional code, identifying with a Viterbi algorithm the code rate used for encoding the signal, and decoding the signal with the valid code rate.

As shown in FIG. 1, the signal decision device has a plurality of add, compare and select (ACS) circuits 10, 12, ..., 1N, a plurality of metric memories 20, 22, ..., 2N, an M break-off circuit 30, a plurality of path memories 40, 42, ..., 4N, and a decision circuit 50. M and N represent natural numbers. The ACS circuit 10, metric memory 20 and path memory 40 constitute Viterbi decoding circuitry. Likewise, the ACS circuits 12–1N, metric memories 22–2N and path memories 42–4N constitute other Viterbi decoding circuitry in combination. In the illustrative embodiment, all the ACS circuits 10–1N and metric memories 20–2N are connected to the input side of the M break-off circuit 30 while the path memories 40–4N are connected to the output side of the circuit 30.

Conventional Viterbi decoding circuits lack the M break-off circuit 30. Specifically, it has been customary to connect the metric memories 20–2N and path memories 40–4N to the outputs of the ACS circuits 10–1N, thereby constituting a plurality of Viterbi decoding circuits which operate independently of each other. By contrast, in the embodiment, the plurality of Viterbi decoding circuitry operate in cooperation with each other via the M break-off circuit 30. The output of the M break-off circuit 30 is connected to the decision circuit 50, allowing it to perform decisions based on the result of break-off.

All the ACS circuits 10–1N receive a signal having come in through an input terminal 60 and having been encoded by a convolutional or similar trellis encoding scheme, i.e., a so-called symbol stream. In response, the ACS circuits 10–1N operate in parallel, i.e., each performs a trellis tracing with the time-varying states of the input signal and delivers the resulting estimate to the M break-off circuit 30. For this purpose, the ACS circuits 10–1N each has a branch metric computing section, an adding section, a comparing section, and a selecting section. During the course of trellis tracing, the branch metric computing section determines the metrics of consecutive branches represented by differences between the values which the coded signal may take and the actual value of the received symbol, e.g., Hamming distances or Euclidean distances. The adding section adds the metrics produced at the preceding branch to the metrics produced at the current branch. The comparing circuit compares the resulting path metrics. The selecting circuit sequentially selects valid paths. The trellis tracing procedure will be described with reference to FIG. 2 which shows a rate ½ convolutional code by way of example.

Figure 2:
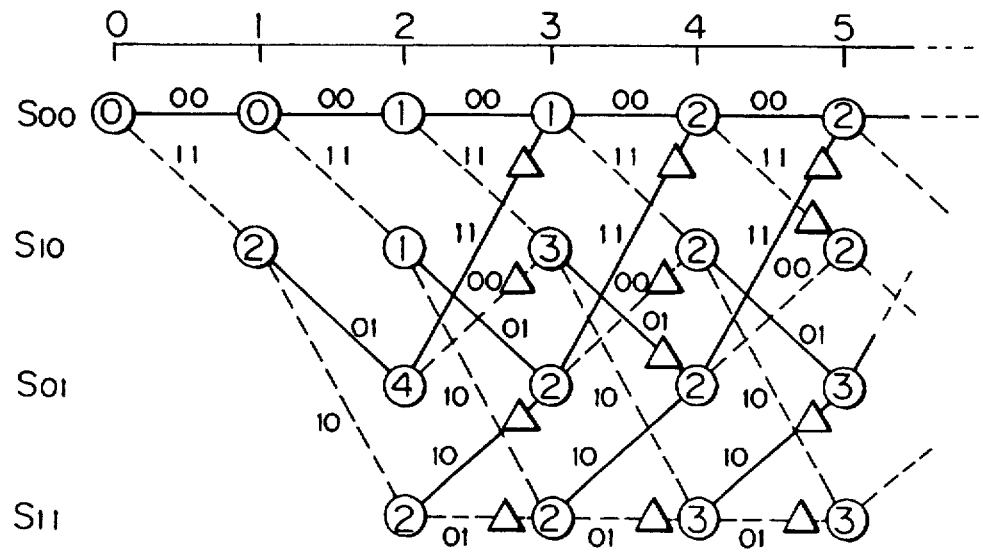
FIG. 2 is a trellis chart demonstrating a specific Viterbi algorithm applicable to the embodiment.

As shown in FIG. 2, the ACS circuits 10–1N each receives two bits of the input signal as a single symbol and sequentially estimates four different states which may be selectively represented by the symbol. The received symbol takes any one of four states S00="00", S10="10", S01="01" and S11="11" each being capable of changing into only one of two alternative states. Assuming that the symbol of the initial state is "00", then the symbol which will be received at the first branch 1 is either "00" or "11". As a result, a transition from the initial state S00 to the state S00 or the state S10 occurs. If the actual received symbol is "00", then a branch metric "0" or "2" is produced at the state S00 or the state S10. In this case, the metric is represented by a Hamming distance.

At the next branch 2, the state S00 again changes into either the state S00 or the state S10, and the state S10 has only a symbol value "01" or "10". As a result, a transition to the state S01 or the state S11 occurs. Therefore, when a symbol "10" is received at the branch 2, branch metrics "1", "1", "2" and "0" are produced at the states S00, S10, S01 and S11, respectively. The preceding branch metrics are respectively added to the above branch metrics to produce path metrics "1", "1", "4" and "2". At this stage of tracing, all the paths and determined metrics are selected and output without being compared.

Assume that the ACS circuits 10–1N have received a symbol "00" at the branch 3. Then, at the state S00 where the transitions from the states S00 and S01 of the branch 2 exist, the circuits 10–1N each adds "0" to "1" to produce "1" as a path metric from the state S00 and adds "2" to "4" to produce "6" as a path metric from the state S01. The circuits 10–1N each compares the path metrics "1" and "6" and then selects the former. Consequently, at the state S00 of the branch 3, the path S00-S00-S00 is selected as a survivor path.

Likewise, at the state S10 of the branch 3, the ACS circuits 10–1N each produces a path metric "3" of the transition from the state S00 of the branch 2 and a path metric "4" of the transition from the state S01, compares them, and then selects a path S00-S00-S01. Also, the ACS circuit selects a path S00-S10-S01 at the state S01 of the branch 3 and selects a path S00-S10-S11 at the state S11. By repeating the above procedure at a branch 4 and successive branches, the ACS circuits 10–1N each produces branch metrics in terms of Hamming distances, adds them to the preceding path metrics, compares the resulting sums, and then selects one path smaller in path metric than the other path. While the above description has concentrated on a rate ½ convolutional code, the ACS circuits 10–1N of the embodiment are each assigned to a particular code rate available with a convolutional encoder located at the transmitter side.

Referring again to FIG. 1, the metric memories 20–2N are respectively associated with the ACS circuits 10–1N. The metric memories 20–2N each receives the path metrics from an associated one of the ACS circuits 10–1N via the M break-off circuit 30 and sequentially updates them on a state-by-state basis. In practice, the metric memories 20–2N may each be implemented by a plurality of latch circuits for feeding, every time a received symbol is input, the respective previous path metrics to the associated ACS circuit branch by branch. Particularly, a conventional Viterbi encoder sequentially writes all the path metrics selected by its associated ACS circuit in the respective metric memory. By contrast, the metric memories 20–2N of the embodiment each updates only the path metrics sequentially narrowed down by the M break-off circuit 30 during trellis tracing, while sequentially feeding them to the associated ACS circuit. As a result, the number of states and therefore the number of metric memories 20–2N is gradually reduced, so that only M memories operate for N ACS circuits 10–1N.

The M break-off circuit 30 is implemented with an M algorithm for detecting M most probable paths out of the paths which are based on the path metrics received from the ACS circuits 10–1N. In the illustrative embodiment, the M break-off circuit 30 performs M break-off over at least each two of the ACS circuits 10–1N. For example, in the trellis tracing shown in FIG. 2, none of the transitions from the state S01 of the branch 2 can survive at the following branch 3. Likewise, while one of the transitions from the state S10 of the branch 3 survives at the branch 4, none of the paths from the state S10 can survive at the branch 5. In this manner, it is possible to break off less probable paths by comparing the metrics of the paths surviving at each branch.

Figure 3:
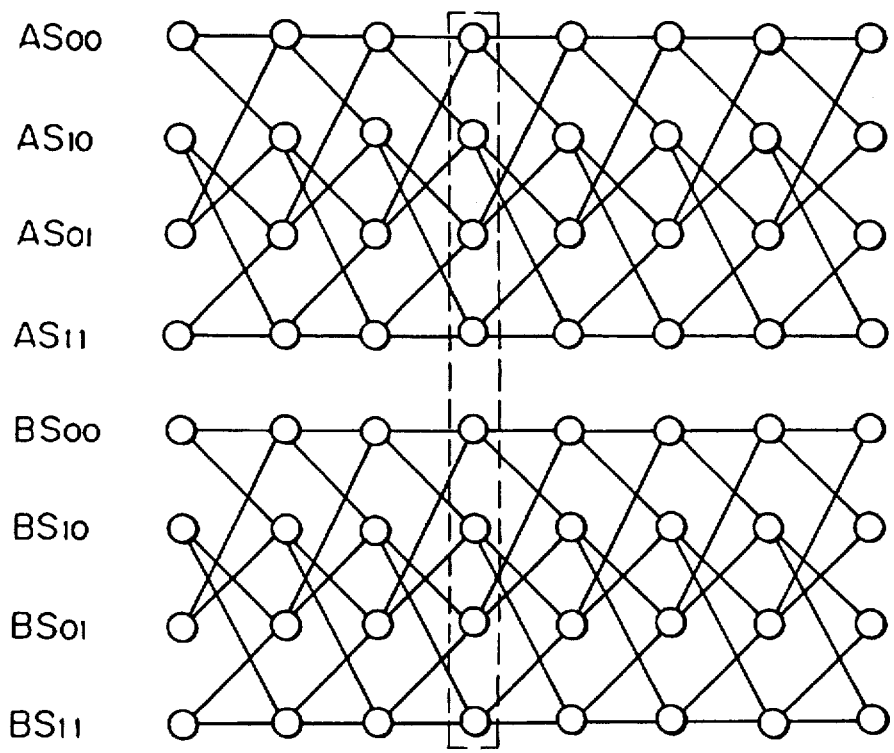
FIG. 3 is a trellis chart demonstrating an M break-off algorithm also applicable to the embodiment.

As shown in FIG. 3, the M break-off of the embodiment is effected over at least two trellis tracings, i.e., at least two of the ACS circuits 10–1N. In this condition, in some of the ACS circuits 10–1N performing trellis tracings with rates different from the code rate of the received symbol, the probability that the survivor paths will remain is less than in the other ACS circuits performing trellis tracings with the rate coincident with the code rate of the received symbol. In this embodiment, the ACS circuits lost the survivor paths due to M break-off are disenabled. This promotes the rapid and efficient operation of the ACS circuits 10–1N.

For example, in the trellis tracing shown in FIG. 3, assume that path metrics from branches enclosed by a phantom line are received from two ACS circuits 1A and 1B. Then, it is possible to narrow down eight different states AS00–BS11 to at least four to six states by comparing the path metrics. At this instant, if the states AS00–BS11 are narrowed down to either the states AS00–AS11 or the states BS00–BS11, it is possible to disenable one of the ACS circuits 1A and 1B. It may occur that one or two paths survive at the states AS00–AS11 or the states BS00–BS11 of the branches enclosed by the phantom line. This, however, does not matter at all because the states are further narrowed down over the two trellis tracings at the next branch, thereby reducing the probability that the paths of either one of the trellis tracings survive. In the case of the ½ code rate, the states AS00–BS11 can be narrowed down to either the states AS00–AS11 or the states BS00–BS11 if the above procedure is repeated a few times.

Further, assume that M break-off is effected over the trellis tracings of the ACS circuits 11–1N narrowed down. Then, it is possible to sequentially reduce the number of active ACS circuits 11–1N, i.e., to narrow them down to M paths of the N trellis tracings within a short interval. In the case of conventional Viterbi decoding, each circuit has states the number of which is the power of 2 for the constraint length of a symbol. As a result, a number of steps several times as great as the number of the above states is necessary for the paths to be narrowed down to one. Moreover, if N circuits exist, then trellis tracing must be effected with $(2^{k1}+2^{k2}+ \ldots +2^{kN})$ different states where k1, k2, ..., kN are constraint lengths, outputting N different paths. It is difficult to effect decisions with such a number of paths. The embodiment not only reduces the number of steps by M break-off, but also narrows down the paths to M paths far smaller in number than N paths. The resulting path metrics and paths are sequentially applied to the decision circuit 50 and path memories 40–4N associated with the operating or active ACS circuits 11–1N.

The paths memories 40–4N receive the paths selected by the associated ACS circuits 10–1N as further narrowed paths via the M break-off circuit 30 and sequentially update existing data. While the conventional Viterbi coding circuits each stores all the paths selected by the respective ACS circuit in the respective path memory, the embodiment stores only M paths via the M break-off circuit 30 while sequentially updating them. It follows that the path memories 40–4N of the embodiment are each operable with a smaller capacity than the path memory of the conventional Viterbi decoding circuit.

The decision circuit 50 receives M survivor paths from the M break-off circuit 30 and detects the most probable path out of them. The decision circuit 50 reads the most probable path out of one of the path memories 40–4N storing it, and then traces back the path so as to output decoded bits representative of the most probable received symbols. In this sense, the decision circuit 50 plays the role of a decoding circuit. Because the embodiment causes the M break-off circuit 30 to narrow down the paths to M paths which can be identified, the decision circuit 50 can perform a decision simply by comparing the path metrics of the last stage of the M survivor paths.

In practice, the transmitter side adds tail bits converging to a single state, over a plurality of steps as a code of the last stage. The decision circuit 50 therefore can select a single path without fail by determining the path metrics of the last stage. It has been customary with the conventional Viterbi decoding scheme to determine decoded bits from each of the N converged paths, re-encode the decoded bits one by one, compare the re-encoded bits with the original received symbols, produce an error probability by the CRC or similar system, and then produce a decision. By contrast, the embodiment is capable of producing a decision directly with the results of Viterbi decoding.

The signal deciding method of the above embodiment will be described together with the operation of the signal decision device. First, sequentially deceived symbols input via the input terminal 60 are applied to all the ACS circuits 10–1N each being assigned to a particular code rate. The ACS circuits 10–1N each sequentially produces branch metrics, adds them to the branch metrics read out last, compares the resulting sums, and then selects one of the paths having a smaller path metric than the other. The paths and path metrics selected by the ACS circuits 10–1N are sequentially fed to the M break-off circuit 30.

In response, the M break-off circuit 30 compares the path metrics output from at least two of the ACS circuits 10–1N. Then, the break-off circuit 30 discards the path metrics of unlikely paths while delivering only the path metrics of the survivor paths to the corresponding metric memories 20–2N. At the same time, the break-off circuit 30 sequentially feeds the survivor paths to the corresponding path memories 40–4N. Consequently, the path metrics of the survivor paths are fed back from the metric memories 20–2N to the trellis tracing at the next branch. This allows the ACS circuits 10–1N to repeat trellis tracing at the next branch.

The resulting paths and path metrics are also fed from the ACS circuits 10–1N to the M break-off circuit 30 and used for M break-off. When the above procedure is repeated a plurality of times, the break-off circuit 30 detects the most probable M paths out of the results of trellis tracings output from the N ACS circuits 10–1N. Among the N ACS circuits that 10–1N, the circuits lost the survivor paths are disenabled. Only the ACS circuits having the survivor paths perform another trellis tracing. This further narrows down the active ACS circuits and thereby produces only the paths surviving at the last stage. The survivor paths are sequentially written to the corresponding path memories 40–4N in place of the existing data while their path metrics are fed to the decision circuit 50.

In response, the decision circuit 50 estimates an encoder used at the transmitting station on the basis of the path metric which is determined at the last trellis stage narrowed down by the M break-off circuit 30. If a plurality of paths each relating to a particular decoder survive at the last trellis stage, then the decision circuit 50 performs a decision by use of the metrics of the last stage. On the other hand, if only a single path relating to a particular decoder survives at the last trellis stage, the decision circuit 50 determines that the signal has been received from an encoder corresponding to the particular decoder including the survivor path.

Finally, the decision circuit 50 traces back one of the path memories 40–4N corresponding to the above decoder, decodes at a preselected rate the symbols read out of the path memory, and then outputs decoded bits via an output 70. The decoded bits are fed to, e.g., a voice decoder and decoded to a speech signal thereby.

As stated above, in the illustrative embodiment, the ACS circuits 10–1N each performs a trellis tracing with a signal of particular code rate. During trellis tracing, M break-off is effected over at least two of the ACS circuits 10–1N so as to detect the most probable M paths. The final decision is made on the basis of the metrics of the detected M paths. Therefore, the paths surviving at the end of the trellis tracing can be directly used for the decision, and the result of the decision can be output as decoded bits. This noticeably reduces the amount of computation necessary for trellis tracing and thereby promotes the high-speed operation and power saving of the circuitry. Moreover, the capacity required of each memory or similar constituent device is reduced. In addition, it is not necessary to re-encode the decoded bits and compare them with the received signal as in the conventional Viterbi decoding circuit, or to add a CRC or similar extra error correcting code. As a result, a simple convolutional code or similar trellis code suffices for signal decision.

Figure 4A:
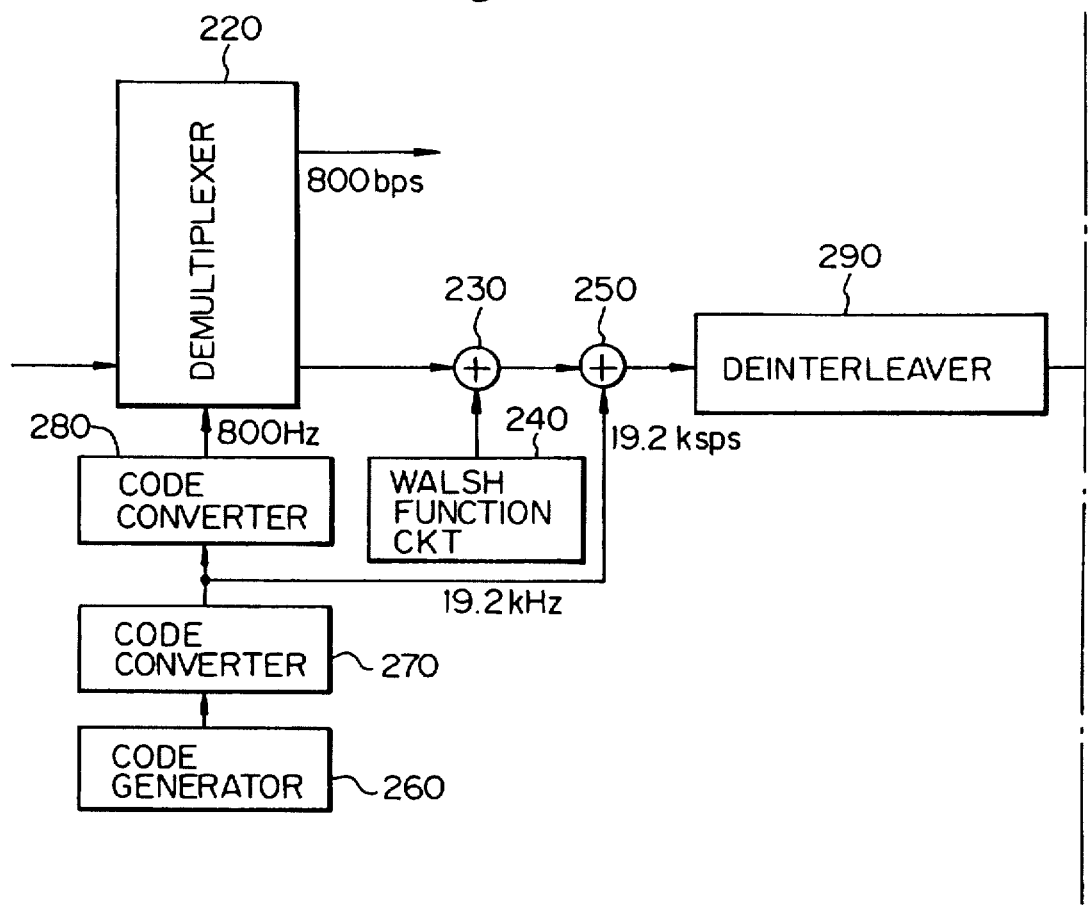
FIGS. 4A and 4B are combined.
Figure 4:
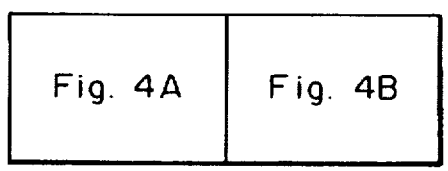
FIG. 4 shows how
Figure 4B:
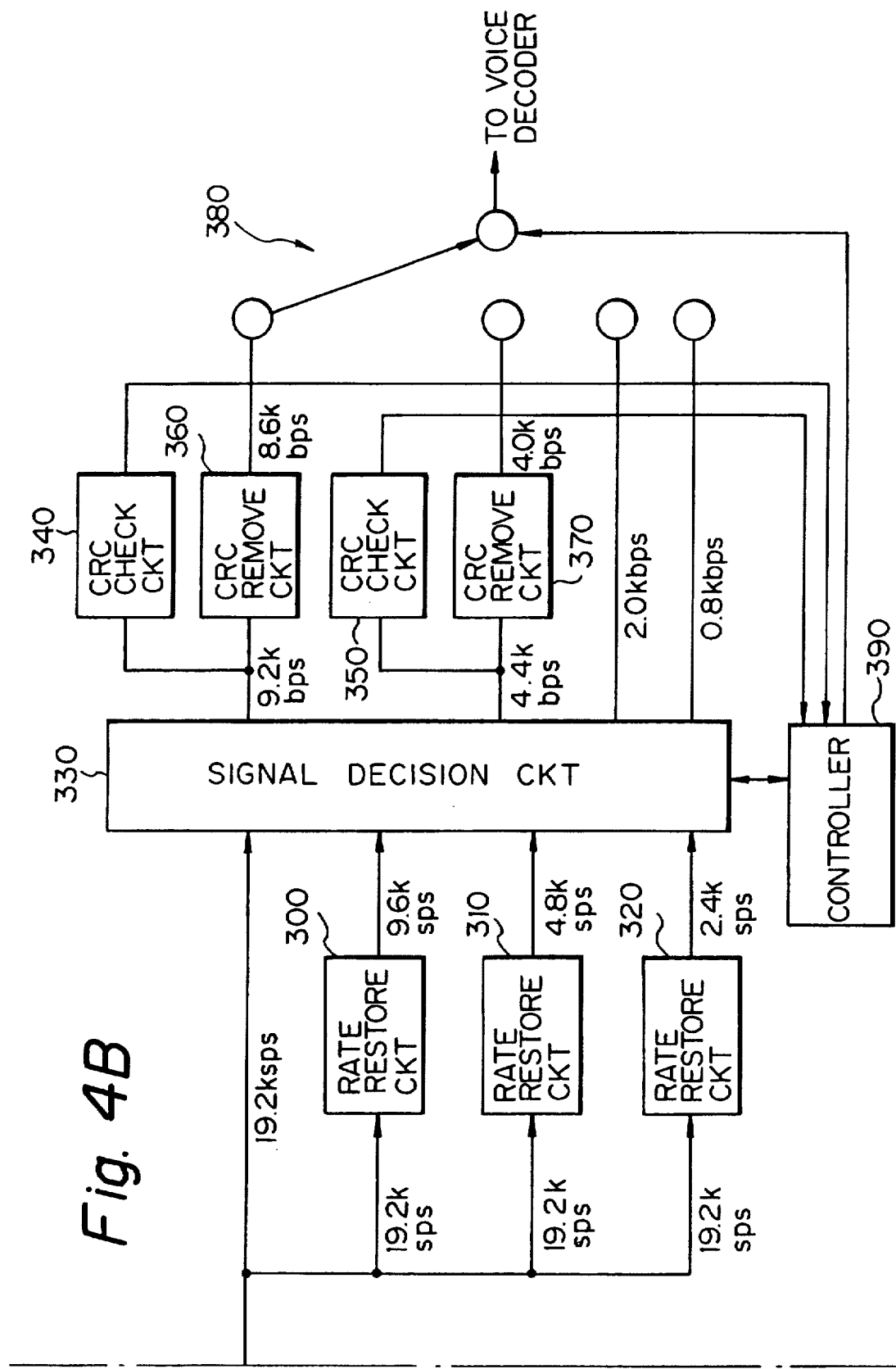

FIGS. 4A and 4B show a receiver implemented with the signal decision device described with reference to FIG. 1. The following description will concentrate on a CDMA handy phone, e.g., a North American CDMA handy phone by way of example. The receiver to be described is capable of receiving a speech code having a rate variable in accordance with the speech rate, effectively identifying the code rate of the received signal without resorting to any change in the specifications of the transmitter side, and then reproducing a speech signal.

Figure 5B:
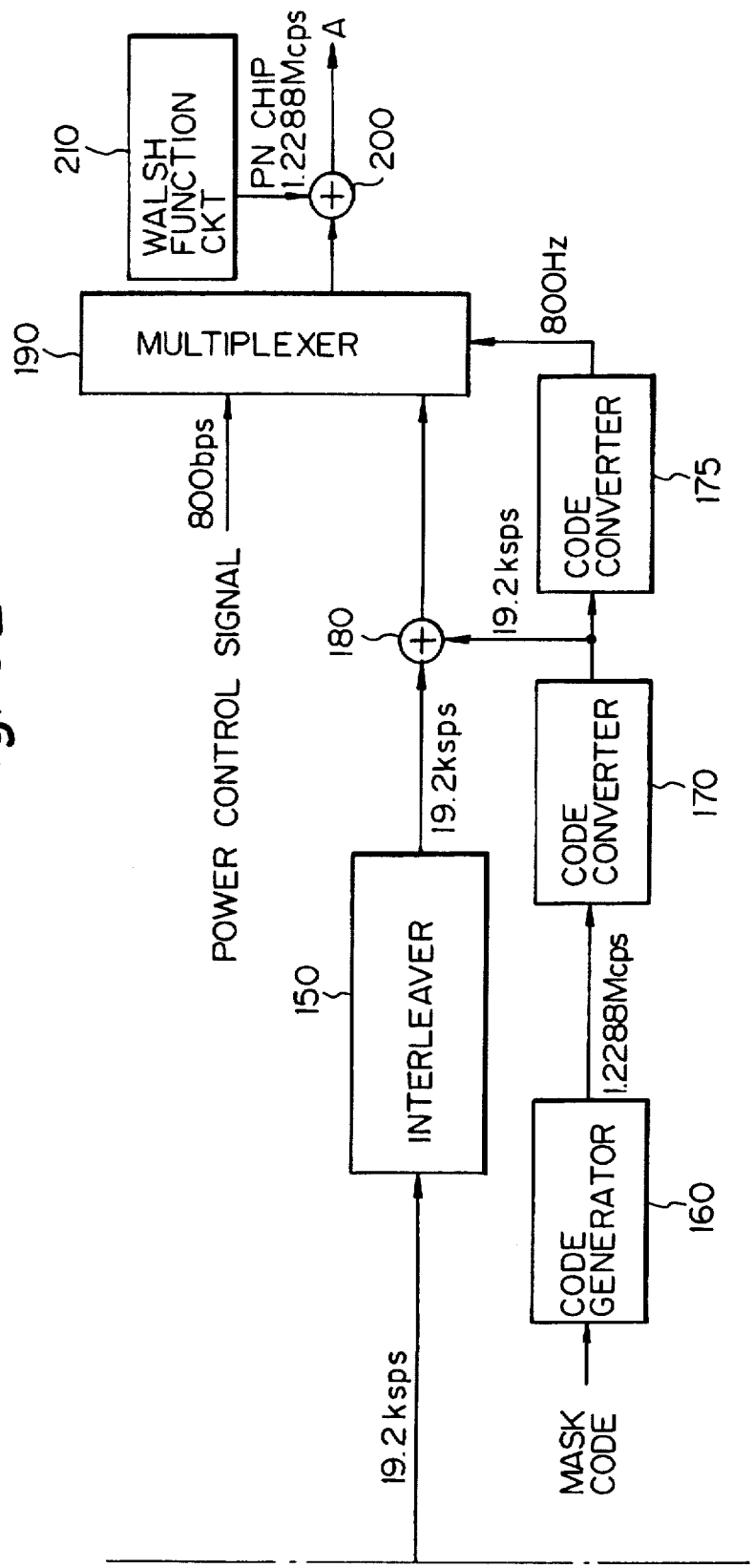

To better understand the receiver having the above capability, a specific transmitter for use with the receiver will be described with reference to FIGS. 5A and 5B. As shown, the transmitter has a voice encoder or vocoder 100 to which a speech is input. The vocoder 100 transforms the input speech to a code having a rate of sixteen, forty, eighty or 172 bits for a single frame (0.8, 2,0, 4.0 or 8.6 kbps) in accordance with the speech rate, i.e., the ratio of the duration of a speech. For the vocoder 100, use may be made of an encoder of the type encoding speech data by the previously mentioned variable rate speech encoding called QCELP.

A CRC add circuit 110 adds a CRC code having, e.g., twelve bits to, among the speech codes of sixty bits to 172 bits, the speech codes of 172 bits and eighty bits. The CRC add circuit 100 adds the CRC code to the result of computation effected with a speech code by use of a conventional scheme. The sixteen-bit, forty-bit, seventy-bit and 172-bit speech codes are output from the CRC add circuit 110 with rates of 0.8 kbps, 2.0 kbps, 4.4 kbps and 9.2 kbps, respectively. A tail bit add circuit 120 adds to each of the speech codes tail bits which may be eight all ZERO bits. As a result, the 0.8 kbps, 2.0 kbps, 4.4 kbps and 9.2 kbps speech codes input to the tail bit add circuit 120 are output with rates of 1.2 kbps, 2.4 kbps, 4.8 kbps and 9.6 kbps, respectively.

A convolutional encoder 130 transforms the 1.2 kbps, 2.4 kbps, 4.8 kbps and 9.6 kbps speech codes to convolutional codes having rates of 2.4 kilosymbols per second (ksps), 4.8 ksps, 9.6 ksps and 19.2 ksps, respectively. In this specific arrangement, the convolutional encoder 130 is a rate ½ encoder for transforming each bit of the speech code to a two-bit one-symbol convolutional code with a preselected algorithm. A repeat circuit 140 repeats the 2.4 ksps signal eight consecutive times. The repeat circuit 140 repeats the 4.8 ksps signal four consecutive times. Further, the repeat circuit 140 repeats the 9.6 ksps signal twice. As a result, all the signals of 2.4 ksps to 19.2 ksps are output from the repeat circuit 140 with the common rate of 19.2 ksps. In this sense, the repeat circuit 140 plays the role of a rate converting circuit. The 19.2 ksps signals are fed to an interleaver or signal convert circuit 150.

The interleaver or signal convert circuit 150 rearranges the encoded frames by block interleave and outputs the resulting signal. The interleaved signal is subjected to spectrum spreading by a PN code or similar false noise and then output. Specifically, the false noise is generated by a code generator 160, transformed to a noise signal of the same rate as the encoded signal, i.e., 19.2 ksps by a first code converter 170, and then applied to a first adder 180. The first adder or signal mixer 180 adds the speech signal fed from the interleaver 150 and the false noise and feeds its output to a multiplexer 190. The output of the adder 180 is a signal subjected to BPSK (Binary Phase Shift Keying) spread. The multiplexer or selector 190 selectively outputs the signal fed from the adder 180 or a 800-bit power control signal. At this instant, the multiplexer 190 superposes on the power control signal 800 Hz false noise received from a second code converter 175.

A second adder 200 adds a Walsh function to the signal output from the multiplexer 190. A Walsh function circuit 210 is an orthogonal transform circuit for transforming, e.g., a plurality of symbols to Walsh symbols by orthogonal coding. The output of the second adder 200, i.e., a signal subjected to orthogonal transformation, is modulated by a modulator, not shown, using false noise and the OQPSK scheme. Then, a radio section, not shown, transmits the OQPSK signal via its front end by superposing it on a carrier.

The receiver of the illustrative embodiment has a radio section, not shown, for transforming the received radio signal to an IF (Intermediate Frequency) signal at its front end. As shown in FIGS. 4A and 4B, the baseband signal is applied to a demultiplexer 220. Specifically, the front end removes the carrier from the received signal and then inversely spreads the signal with the same false noise as used at the transmitter side for the OPQSK modulation, thereby producing a desired baseband signal. The demultiplexer 220 is a separator for separating the power control signal and main signal from the received signal. The separated power control signal is fed to a control section, not shown while the main signal is applied to a first adder 230. The first adder 230 adds the main signal and a Walsh function received from a Walsh function circuit 240, thereby outputting a signal subjected to inverse orthogonal transformation.

The Walsh function circuit 240 is an inverse orthogonal transform circuit for generating the same Walsh function as generated at the transmitter side. A second adder 250 inversely spreads the signal that has undergone inverse orthogonal transform by use of the same false noise as used at the transmitter side. A code generator 260 generates the same PN code or similar false noise signal as generated at the transmitter side. A code converter 270 converts the inversely spread signal to the same rate as the signal (19.2 ksps) and feeds it to a second adder 250. The resulting output of the second adder 250 is restored to symbols and then applied to a deinterleave circuit or deinterleaver 290.

The deinterleaver or signal converter 290 rearranges the symbols received from the adder 250 in their original order. The signal output from the deinterleaver 290 is directly applied to a signal decision circuit 330 on the one hand and is applied to the circuit 330 by way of three rate restore circuits 300, 310 and 320 on the other hand. The rate restore circuits 300–320 respectively reconstruct the 9.6 ksps, 4.8 ksps and 2.4 ksps symbols occurring at the transmitting station out of the 19.2 ksps signal. Specifically, the code restore circuits 300–320 are adders for respectively restoring the original code rates by repeatedly adding the symbols twice, four times, and eight times.

The signal decision circuit 330 has the arrangement described with reference to FIG. 1. In the specific configuration, four Viterbi decoders are connected to a single M break-off circuit and respectively decode 19.2 ksps, 9.6 ksps, 4.8 ksps and 2 ksps symbols to 9.2 kbps, 4.4 kbps, 2.0 kbps and 0.8 kbps signals. Only the decoded bits whose rates have been determined by the decision circuit 330 are output. Assume that the symbols are decoded at the rate of 9.2 kbps or 4.4 kbps. Then, a CRC check circuit 340 or 350 executes error correction with the decoded symbols by using the CRC scheme. Subsequently, a CRC remove circuit or remover 360 or 370 removes the CRC bits from the symbols and then delivers the symbols to a voice decoder, not shown, via a selecting circuit 380.

The selecting circuit 380 selects the decoded signal under the control of a controller 390 and feeds it to the voice decoder. The controller 390 controls the selecting circuit 380 on the basis of the outputs of the signal decision circuit 330 and CRC check circuits 340 and 350.

In operation, the signal arrived at the receiver is demodulated by the front end and then applied to the demultiplexer 220 as a baseband signal. The demultiplexer 220 selects the power control signal and main signal included in the input baseband signal. The power control signal and main signal are applied to the control section and first adder 230, respectively. In response, the first adder 230 adds the main signal and the Walsh function fed from the Walsh function circuit 240 and identical with the Walsh function used at the transmitter side. As a result, the adder 230 outputs a signal subjected to inverse orthogonal transformation. Further, the second adder 230 adds the signal output from the adder 230 and the signal output from the code converter 270 which is derived from the same false noise as used at the transmitter side and generated by the code generator 260. Consequently, the adder 230 outputs an inversely spread signal. The deinterleave circuit 290 rearranges the symbols of the inversely spread signal and thereby reconstructs the original signal in the form of a symbol sequence.

The signal output from the deinterleave circuit 290 is applied to the signal decision circuit 330 both directly and by way of the rate restore circuits 300, 310 and 320. The rate restore circuits 300, 310 and 320 restore the rates of the input signal. At this stage of procedure, the code rate which the signal has is not yet known. In any case, 2.4 kbps, 4.8 kbps, 9.6 kbps and 19.2 kbps signals are produced from a single received signal by the rate restore circuits 300–320. These signals are also applied to the signal decision circuit 330. The decision circuit 330 determines the code rate which the signal has, and then outputs the decoded bits of the determined code rate. At this instant, the decision circuit 330 narrows down the paths to probable paths by M break-off during the trellis tracing of the individual signal. Finally, the decision circuit 330 selects one of M survivor paths and decodes only the 1path selected. As a result, the signal resulting from the signal decision can be directly used as decoded bits. With a conventional receiver, it is necessary to select four paths with four Viterbi decoding circuits, reconvert them to convolutional codes, compare the codes with received signals of corresponding rates, and then make a decision with the signals.

The signal decoded by the decision circuit 330 is fed to the select circuit 380 both directly and by way of the CRC remove circuits 360 and 370. At the same time, the result of decision is fed from the decision circuit 330 to the controller 390. In response, the controller 390 so controls the select circuit 380 as to deliver the decoded bits to the voice decoder. As a result, a speech is decoded in accordance with the code rate and reproduced. As for the 9.2 kbps and 4.4 kbps signals, they are subjected to error correction by the CRC check circuits 340 and 350, respectively, and then routed through the select circuit 380 to the voice decoder with their CRC bits removed. However, in the illustrative embodiment, the CRC checking procedure is not essential because the decision circuit 330 executes error correction by Viterbi decoding.

As stated above, the receiver implemented with the circuitry of FIG. 1 is capable of decoding a signal by signal decision which does not need any error detecting code. This eliminates an overhead relating to the communication channel. Further, in any of the communication systems recommended in the past, more accurate signal decision is achievable without resorting to any change in the specifications of a transmitter only if the results of decision using an error correcting code particular to the system are combined.

While the embodiment has concentrated on the North American CDMA system, the receiver of the present invention is similarly applicable to, e.g., a North American TDMA or similar TDMA handy phone. In such a case, a transmitter will transform a speech signal and FACCH to a convolutional code at different rates in the data field of the same slot. For example, the transmitter may assign code rates of ½ and ¼ to the speech signal and FACCH, respectively. Therefore, two Viterbi decoders each having a particular code rate for signal decision will be prepared and operated in cooperation with each other via an M break-off circuit, as in the illustrative embodiment. Of course, use will be made of decoding circuits of the type executing TDMA demodulation.

Figure 6:
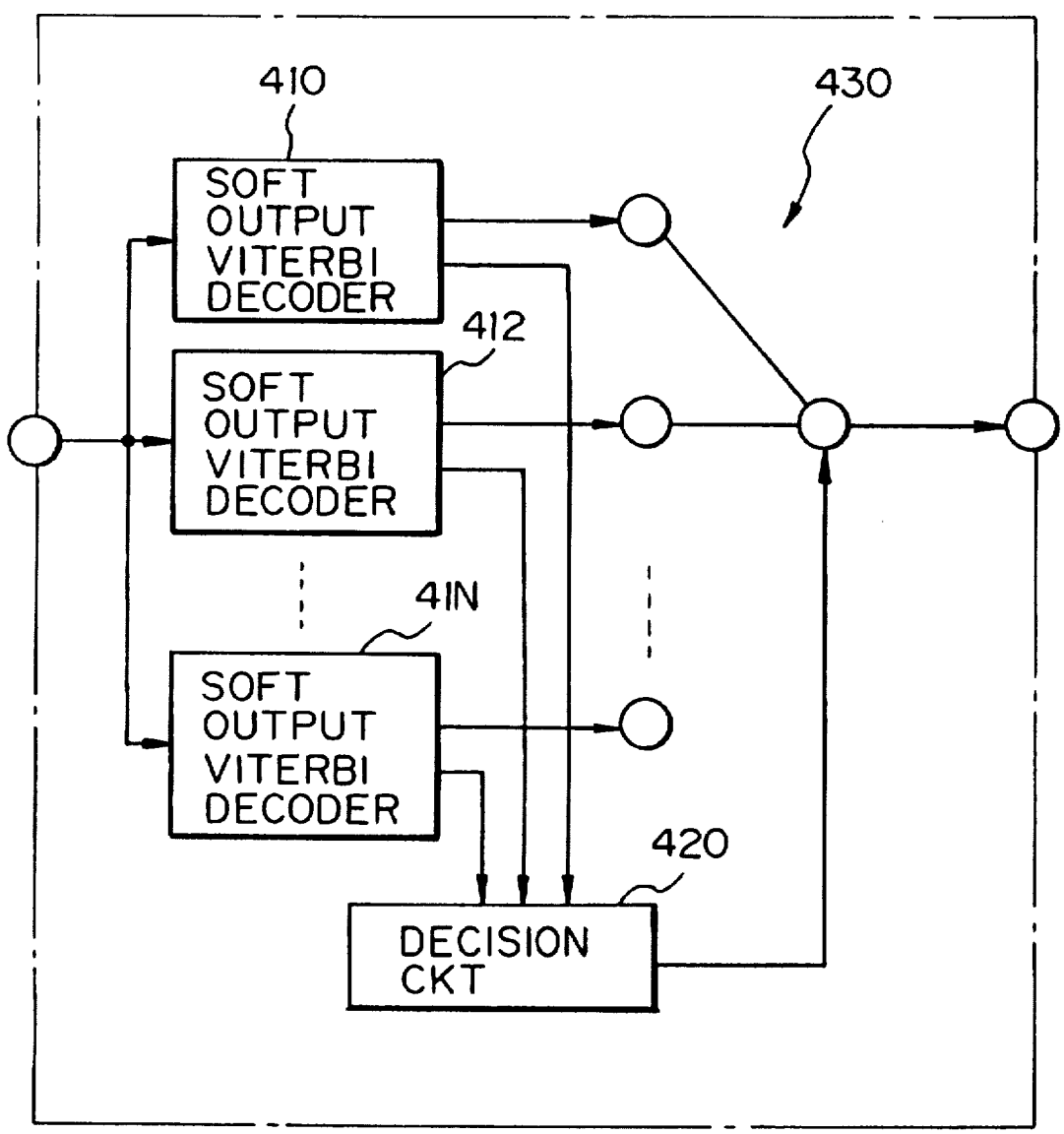
FIG. 6 is a block diagram schematically showing an alternative embodiment of the present invention.

Referring to FIG. 6, an alternative embodiment of the signal decision device in accordance with the present invention will be described. As shown, this embodiment differs from the previous embodiment in that the M break-off circuit 30 is absent, and in that the Viterbi decoding circuits are implemented as soft output Viterbi decoders 410, 412, ..., 41N. These decoders 410–41N output paths selected by trellis tracing and reliability information representative of the degrees of reliability of the paths. The decision device selects decoded bits on the basis of the reliability information.

As shown in FIG. 6, the decision device has a decision circuit 420 and a select circuit 430 in addition to the soft output Viterbi decoders 410–41N. The decoded bit outputs of the decoders 410–41N are connected to the select circuit 430. The reliability information outputs of the decoders 410–41N are connected to the decision circuit 420.

Figure 7:
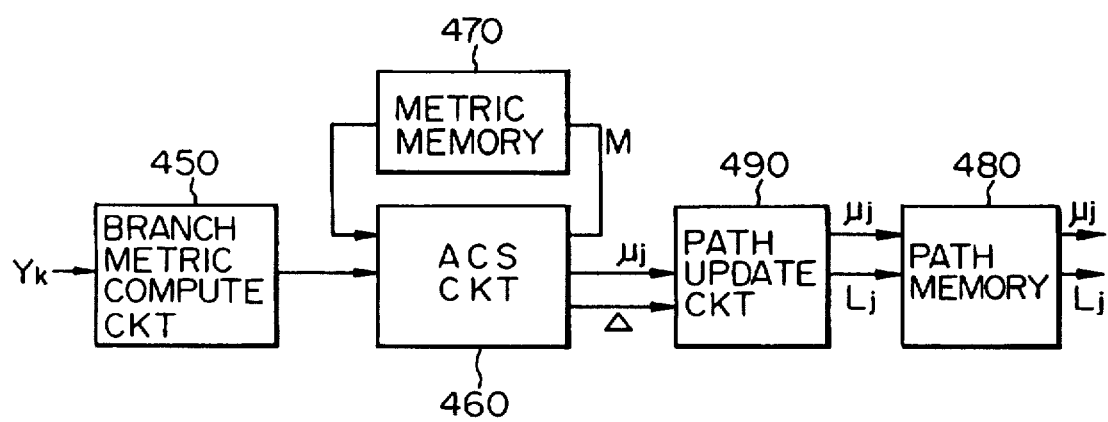
FIG. 7 is a block diagram schematically showing a specific configuration of a soft output Viterbi decoder included in the embodiment of FIG. 6.

As shown in FIG. 7 in detail, the decoders 410–41N each has a branch metric compute circuit 450, an ACS circuit 460, a metric memory 470, a path memory 480, and a path update circuit 490. A received symbol Yk is input to the branch metric compute circuit 450. In response, the compute circuit 450 produces branch metrics on the basis of the symbol Yk and its estimate Xk. The ACS circuit 460 adds up branch metrics sequentially applied thereto from the compute circuit 450, and compares the resulting path metrics so as to sequentially select valid paths. Particularly, in the illustrative embodiment, when the ACS circuit 460 has selected one of a plurality of paths at each branch, it determines a difference between the greatest metric and the smallest metric at the branch and outputs it together with the path selected.

Figure 8:
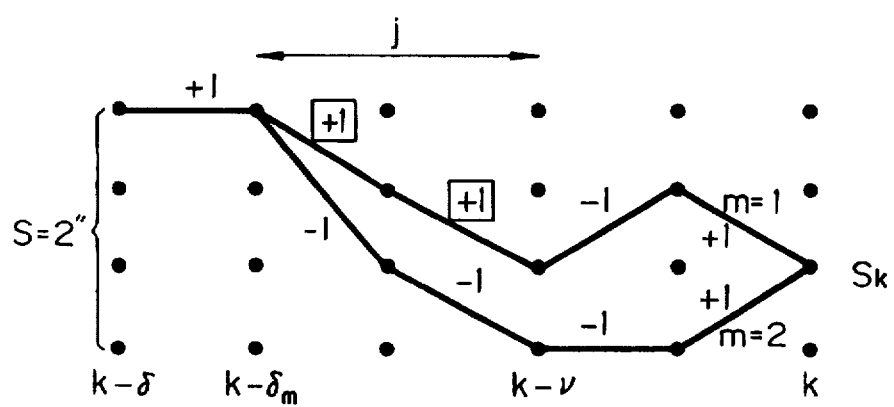
FIG. 8 is a trellis chart demonstrating a signal decision procedure particular to the embodiment of FIG. 6.

For example, as shown in FIG. 8, assume that the ACS circuit 460 has selected a metric m=1 or m=2 at a state Sk of a branch k. Then, the ACS circuit 460 determines a difference between m=1 and m=2, i.e., Δ=1 and outputs it. Specifically, the ACS circuit of the ordinary Viterbi decoding circuit selects only the path of the smallest metric, and then outputs only the path and path metric. By contrast, in this embodiment, the ACS circuit 460 produces a difference Δ between the greatest metric and the smallest metric at each branch. The difference Δ is an index showing what kinds of paths are compared and selected at each of the consecutive branches. The difference or index Δ and the path selected are fed to the path update circuit 490 while the path metric of the path selected is written to the metric memory 470.

The metric memory 470 may advantageously be implemented by a plurality of latch circuits capable of sequentially updating the path metrics selected by the ACS circuit 460, and feeding back the updated path metrics to the ACS circuit 460 branch by branch, as in the previous embodiment. The path memory 480 sequentially updates the path selected by the ACS circuit 460. Particularly, in this embodiment, the path memory 480 stores the reliability information of the path together with the path.

The path update circuit 490 includes a memory control circuit for controlling the writing of the path in the path memory 480. Particularly, the circuit 490 includes a circuit for computing, when the path selected is different from the previous path, reliability information based on the difference between the metrics and fed from the ACS circuit 460, and causing it to be written to the path memory 480. Again, assume that one of the two paths shown in FIG. 8 is selected at the state Sk of the branch k. Then, metrics Mm derived from a maximum likelihood decision taking account of channel noise may be expressed as:

$$Mm = Es/No \; \Sigma(Yjn - Xjn)^2 \qquad \text{Eq. (1)}$$

where Es/No denotes a signal-to-noise ratio, Yjn denotes a received symbol, Xjn denotes an estimate, and a suffix jn shows that the symbol values X and Y are representative of a symbol at the state n of a branch j. It follows that the probability Prob{path m} of a path in a given interval m is produced by:

$$\text{Prob}\{\text{path } m\} \sim e^{-Mm} \qquad \text{Eq. (2)}$$

Therefore, assuming that the metrics Mm are M1 and M2 at a given branch, then the probability Pj that the path having the metric M2 will be selected is expressed as:

$$Pj = e^{-M2}/(e^{-M1} + e^{-M2}) \qquad \text{Eq. (3)}$$
$$= 1/(1 + e^{M2-M1})$$
$$= 1/(1 + e^d)$$

where d=M2−M1.

Consequently, the reliability Lj of the path selected is produced by:

$$Lj = \log(1 - Pj)/Pj \qquad \text{Eq. (4)}$$

Therefore, when the path uj selected is different from the previous path uk, the path update circuit 490 computes the reliability information Lj of the path uj using the difference Δ between the metrics, as follows:

$$Lj \leftarrow f(Lj, \Delta) = (1/a)\log(1+e^{(aLj+d)})/(e^d + a^{aLj})$$   Eq. (5)

where a=4Dfree(Es/No) where Dfree denotes a given step interval of a symbol, the index d denotes the difference Δ between the metrics, and the symbol "←" shows that the reliability information Lj to be stored is computed by f(Lj, Δ) and then stored in place of the previous Lj.

Referring again to FIG. 6, the decision circuit 420 receives the reliability information from the soft output Viterbi decoders 410–41N and then selects the most reliable result of decoding. The decision circuit 420 controls the select circuit 430 on the basis of the most reliable result. The select circuit or output circuit 430 is implemented by a selector or a switch having a plurality of inputs and a single output.

The signal decision procedure of this embodiment will be described together with the operation of the signal decision device. Received symbols are sequentially applied to all the soft output Viterbi decoders 410–41N each being assigned to a particular code rate. The decoders 410–41N each performs a trellis tracing with the input symbol at the respective code rate and then outputs the result of the tracing and reliability information. At this instant, the individual metric compute circuit 450 sequentially produces branch metrics while feeding them to the ACS circuit 460.

The ACS circuit 460 receiving the branch metrics adds them to the previous branch metrics, compares the resulting sums or path metrics, and then selects one path having a smaller path metric than the other path. At the same time, the ACS circuit 460 produces a difference Δ between the greatest metric and the smallest metric at each branch and delivers it to the path update circuit 490. The path metrics are sequentially written to the metric memory 470 for thereby updating the memory 470. When another symbol is input to the metric compute circuit 450, the path metrics are fed back from the metric memory 470 to the ACS circuit 460 at the same time as the supply of new metrics.

The ACS circuit 460 repeats the above trellis tracing over a given interval. As a result, as shown in FIG. 8 specifically, a single path exists in the interval between a branch k-δ and a branch k-δm preceding the branch k. The single path diverges into two paths in the interval between the branch k-δm and the branch k, and then remerges at the branch k. On receiving the resulting path and the difference Δ between the metrics, the path update circuit 490 computes the reliability information of the path selected on the basis of the difference Δ and then updates the path memory 480 with the computed information and the path.

When the Viterbi decoders 410–41N each traces the metrics up to the final stage by repeating the above procedure, it determines a path matching the respective code rate. The reliability information relating to the paths determined by all the decoders 410–41N are read out of the associated path memories 480 and applied to the decision circuit 420. In response, the decision circuit 420 compares the reliability information, selects one of the decoders 410–41N outputting the most probable result, and then feeds a switching signal to the select circuit 430. The select circuit 430 selects one of the decoders 410–41N designated by the switching signal, so that the result of decoding of the decoder selected is output via an output terminal.

As stated above, in the illustrative embodiment, each of the Viterbi decoders 410–41N is assigned to a particular code rate determines the reliability information of a path selected during the course of trellis tracing. The final signal decision is made on the basis of the reliability information output from the decoders 410–41N. The embodiment therefore performs reliable signal decision and can directly output the result of the decision as decoded bits.

The embodiment makes it necessary to re-encode the decoded bits and compare them with a received signal as in the conventional signal decision using Viterbi coding circuits. Moreover, the embodiment is practicable without adding a CRC or similar error correcting code. Therefore, only a convolutional code or similar trellis code suffices for sure signal decision.

Figure 9A:
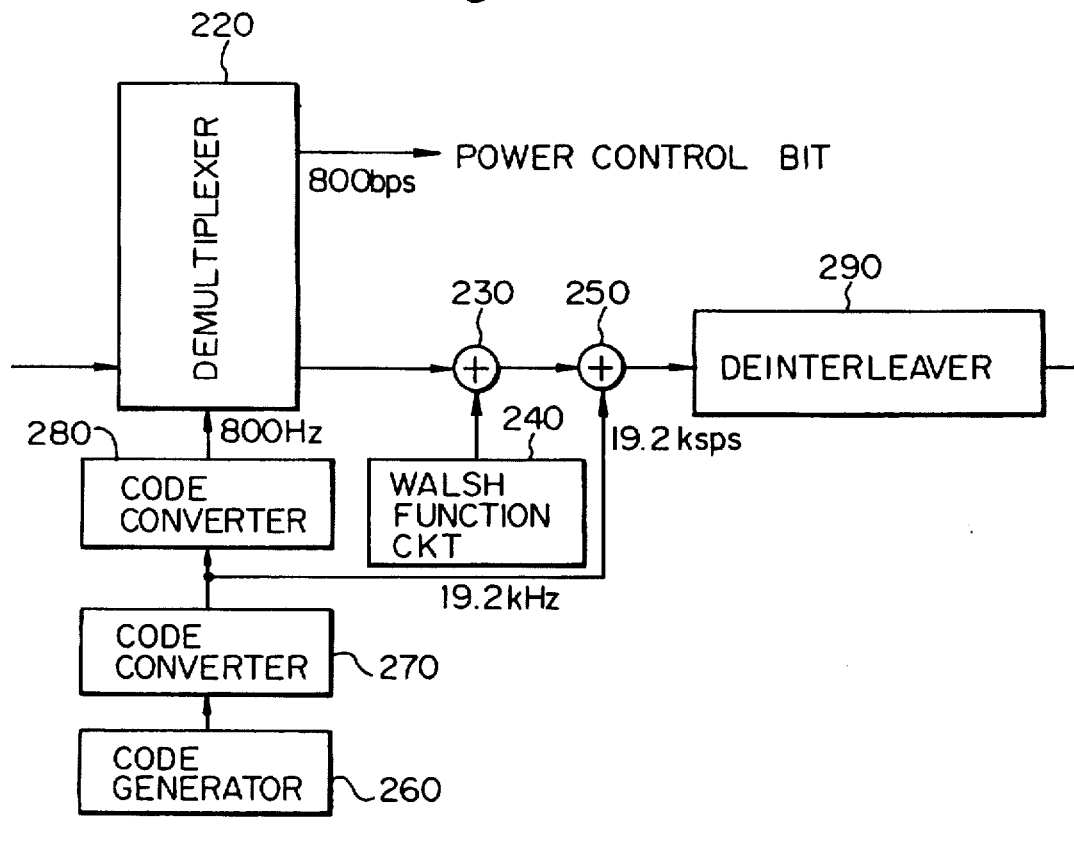
Figure 9:
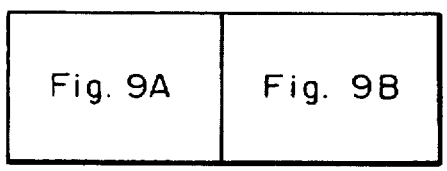
FIG. 9 shows how

FIGS. 9A and 9B show a receiver implemented with the signal decision device shown in FIG. 6. This receiver, like the receiver shown in FIGS. 4A and 4B, is assumed to be applied to a North American CDMA handy phone by way of example. The receiver to be described also receives a speech code having a code rate variable with a speech rate, effectively determines the code rate of the speech signal without resorting to any change in the specifications of a transmitting station, and then reproduces a speech. It follows that a transmitter applicable to the receiver also has the configuration shown in FIGS. 5A and 5B and will not be described specifically. In FIGS. 9A and 9B, the same or similar constituent parts as or to the parts shown in FIGS. 4A and 4B are designated by the same reference numerals and will not be described in order to avoid redundancy.

The receiver shown in FIGS. 9A and 9B differs from the receiver shown in FIGS. 4A and 4B in that four soft output Viterbi decoders 410–416 are substituted for the Viterbi decoding circuits with the M break-off circuit 30. A select circuit 430 is operated on the basis of a code rate derived from the reliability information output from the Viterbi decoders 410–416.

As shown in FIGS. 9A and 9B, the 19.2 kbps received signal output from the deinterleaver 290 is directly applied to the first soft output Viterbi decoder 410. Also, the received signal is applied to the second, third and fourth soft output Viterbi decoders 412, 414 and 416 via the first, second and third rate restore circuits 300, 310 and 320, respectively. The rate restore circuit 300 transforms the 19.2 kbps signal to a 9.6 ksps signal and feeds it to the soft output Viterbi decoder 412. Likewise, the rate restore circuit 310 transforms the input signal to a 4.8 ksps signal and feeds it to the soft output Viterbi decoder 414. Further, the rate restore 320 transforms the input signal to a 2.4 ksps signal and feeds it to the soft output Viterbi decoder 416. The Viterbi decoders 410–416 are rate ½ decoders, and each performs a trellis tracing at a timing matching the respective code rate.

On receiving the 19.2 ksps symbol, the Viterbi decoder 410 performs a trellis tracing based on the Viterbi algorithm, sequentially selects the most probable paths, and then outputs 9.2 kbps decoded bits. At this instant, the Viterbi decoder 410 sequentially computes the reliability information of the paths selected while feeding them to the decision circuit 420. Likewise, the Viterbi decoder 412 receiving the 9.6 ksps symbol outputs 4.4 kbps decoded bits, and feeds reliability information to the decision circuit 420. Further, the Viterbi decoders 414 and 416 receiving the 4.8 ksps symbol and 2.4 ksps symbol, respectively, output 2.0 kbps and 0.8 kbps decoded bits, and each feeds the respective reliability information to the decision circuit 420.

The decision circuit 420 selects one of the results of decoding output from the Viterbi decoders 410–416 and having the highest reliability as represented by the the reliability information. Then, the decision circuit 420 feeds a switching signal to the select circuit 430. In response, the select circuit 430 delivers the result of decoding having the highest reliability to a voice decoder, not shown.

The decoded bits output from the first and second Viterbi decoders 410 and 412 are respectively subjected to error correction by the CRC check circuits 340 and 350, respectively. When the output of the Viterbi decoder 410 or 412 is selected, the CRC remove circuit 360 or 370 associated with the decoder 410 or 412 removes CRC check bits from the decoded bits. At this instant, the check circuits 340 and 350 each delivers the respective error probability to the decision circuit 420. The decision circuit 420 selects decoded bits by referencing the error probabilities received from the CRC check circuits 340 and 350 and the reliability information. However, this CRC error correction is not essential with the embodiment because the Viterbi decoders 410 and 412 execute error correction with the decoded bits by use of the Viterbi algorithm.

As stated above, the receiver of the illustrative embodiment has Viterbi decoders based on the soft output Viterbi algorithm. Reliability information relating to the results of decoding are output from such Viterbi decoders, so that signal decision can be made on the basis of the reliability information. As a result, accurate signal decision is enhanced to allow valid decoded bits to be produced. Further, because the reliability information plays the role of indexes, it is not necessary to add, e.g., an extra error correcting code. Therefore, the receiver does not constrain the performance of the communication channel and does not require any change in the specifications of the transmitter side.

While the receiver of the embodiment has been shown and described in relation to the North American CDMA handy phone, it is similarly applicable to, e.g., a North American TDMA or similar TDMA handy phone. In such a case, two soft output Viterbi decoders each having a particular decoding rate will be prepared to allow the receiver to execute signal decision with reliability information output from the decoders. A decoded speech signal and control information will be fed to a voice decoder and a control circuit, respectively. Of course, decoding circuits will be implemented with the TDMA decoding system.

Figure 10:
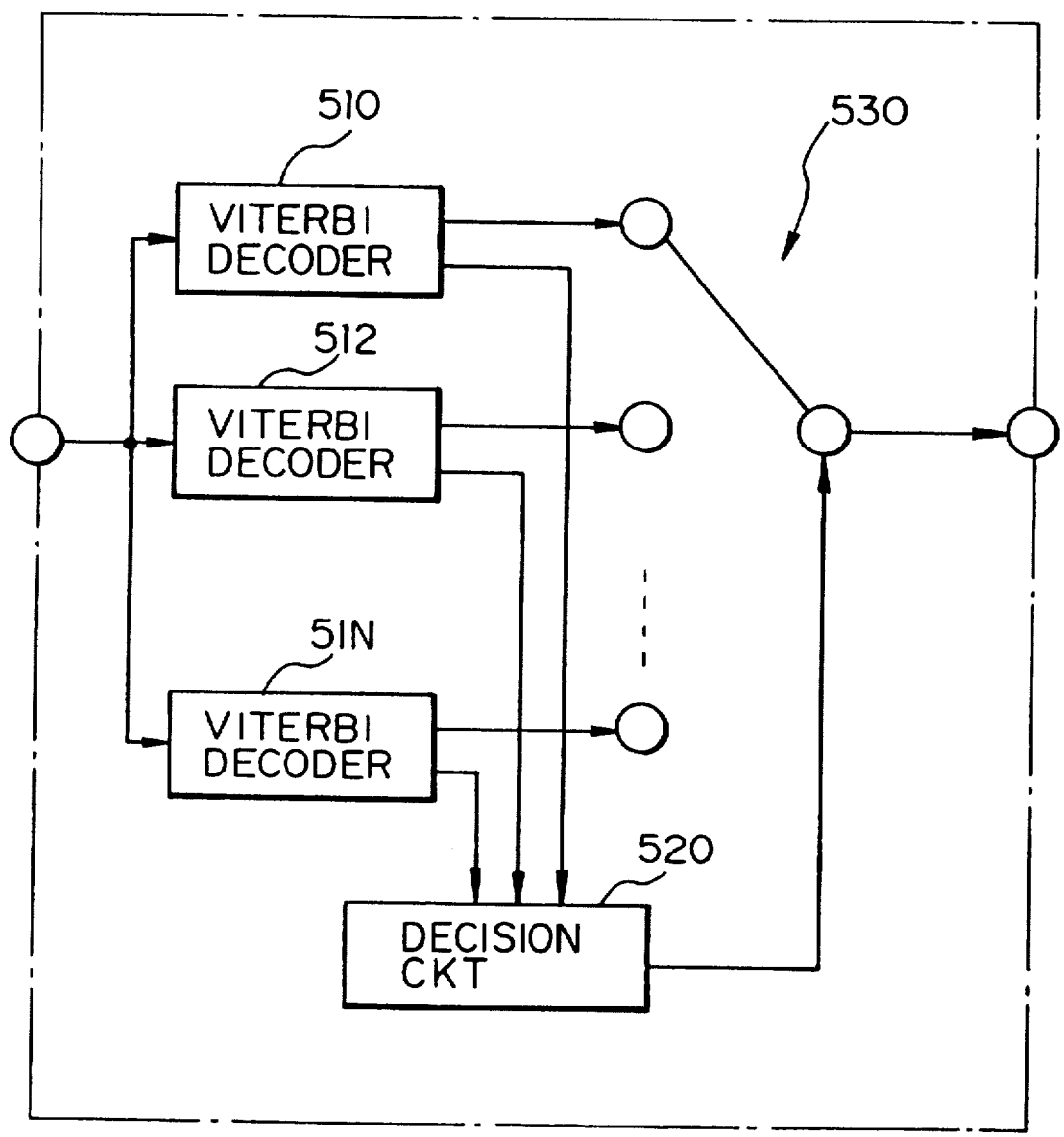
FIG. 10 is a block diagram schematically showing another alternative embodiment of the present invention.
Figure 11:
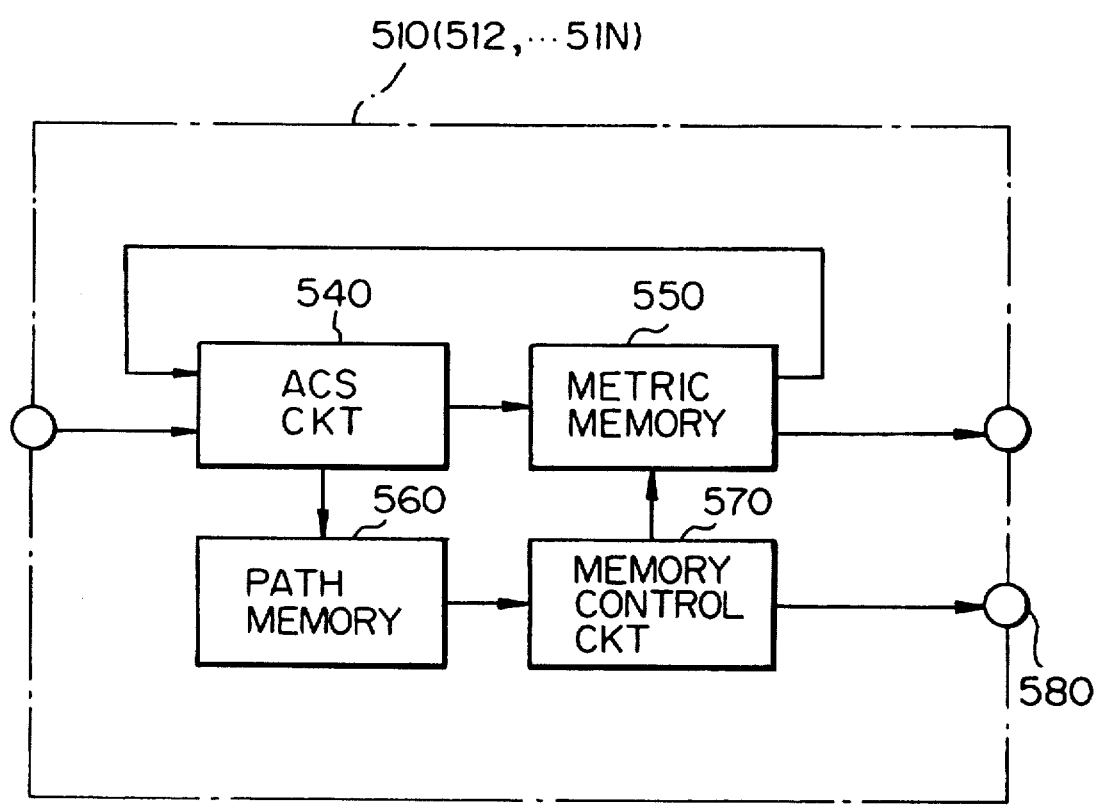
FIG. 11 is a block diagram schematically showing a specific configuration of a Viterbi decoder included in the embodiment of FIG. 10.

Referring to FIG. 10, another alternative embodiment of the signal decision device in accordance with the present invention is shown. This embodiment is similar to the embodiment shown in FIG. 6 except for the following. As shown, the device includes a plurality of Viterbi decoders 510, 512, ..., 51N for performing a trellis tracing each. The device estimates channel conditions on the basis of the metrics of the paths of the last stage output from the Viterbi decoders 510–51N, thereby determining which of the decoders 510–51N has output a correct result of decoding. Particularly, as shown in FIG. 11, the Viterbi decoders 510–51N each includes a memory controller 540 for detecting a survivor path stored in a path memory 560, and reading the path metric of the last stage out of a metric memory 550.

Specifically, the device shown in FIG. 10 has a decision circuit 520 and a select circuit 530 in addition to the Viterbi decoders 510–51N. The Viterbi decoders 510–51N each performs a trellis tracing based on the Viterbi algorithm and outputs decoded bits of the respective code rate. At the same time, the decoders 510–51N each reads the path metric of the last stage and delivers it to the decision circuit 520. More specifically, as shown in FIG. 11 specifically, the decoders 510–51N each has an ACS circuit 540 in addition to the metric memory 550, path memory 560, and memory controller 570. The ACS circuit 540 produces branch metrics in response to received symbols, sequentially adds them, compares the resulting path metrics, and then sequentially selects paths each having the smallest path metric, as in the embodiment shown in FIG. 1. The ACS circuit 540 sequentially delivers the path metrics of the paths selected to the metric memory 550, while sequentially delivering the paths selected to the path memory 560.

Figure 12:
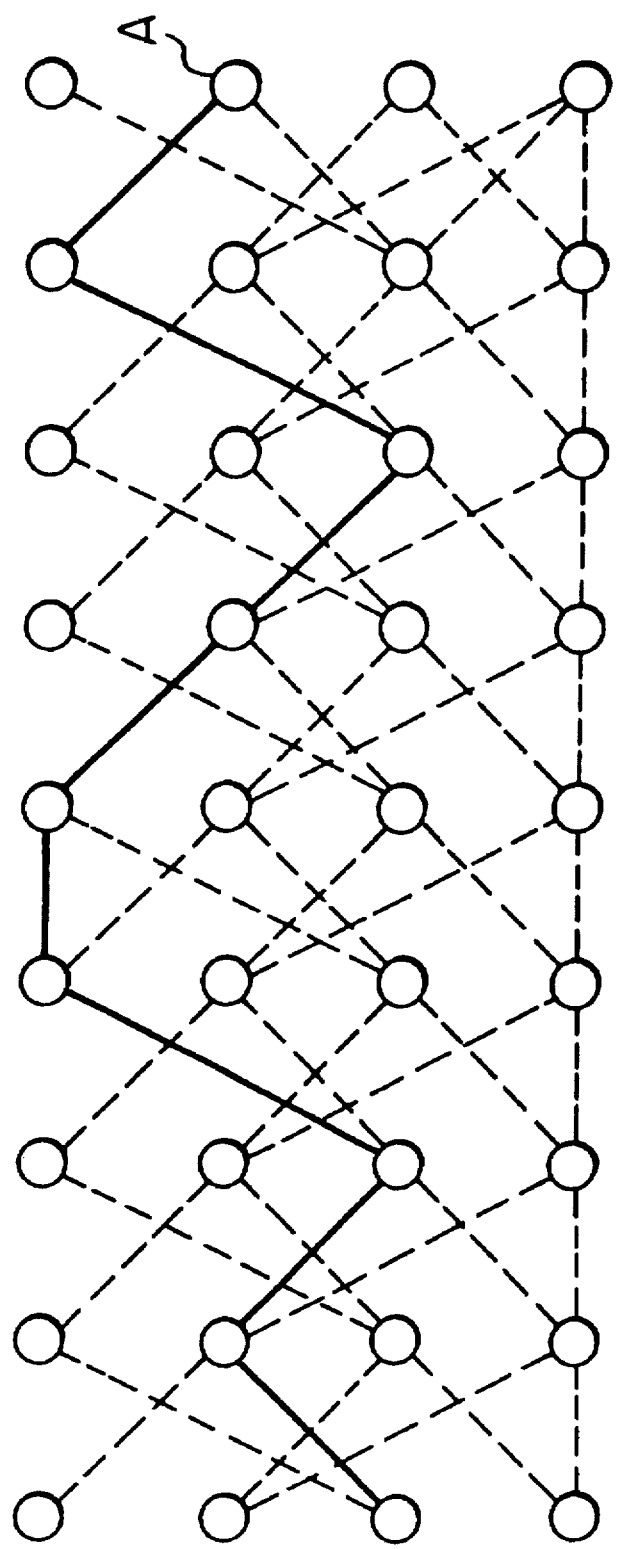
FIG. 12 is a trellis chart showing a specific path traced up to the last stage in the embodiment of FIG. 10.

In the above condition, the path metrics stored in the metric memory 550 contain channel noise, as represented by the Eq. (2) stated in relation to the embodiment of FIG. 6. Stated another way, path metrics are the sum of differences between received symbols and their estimates produced at the consecutive branches. Therefore, if channel noise is practically zero and if the code rate of a given Viterbi decoder matches the code rate of a received signal, then the path metrics of the decoder should finally converge to zero. Further, all the Viterbi decoders 510–51N receive the same signal. Hence, even taking account of channel noise, it is expected that the final path metric output will be smaller when the Viterbi decoder matches the code rate than when the former does not match the latter. Consequently, a path metric written to the metric memory 550 at the final stage A of trellis tracing shown in FIG. 12 can be used as an index representative of the channel conditions of the path surviving after the tracing. In this sense, the metric memory 550 of this embodiment serves as an index storage for storing the index representative of the channel conditions.

The path memory 560 is updated based on the paths sequentially selected by the ACS circuit 540. In this embodiment, the path memory 560 is indicative of the position of the final branch of the survivor path. The memory controller 570 reads the survivor path out of the path memory 560, traces it back, and then outputs decoded bits via a terminal 580. In the illustrative embodiment, the memory controller 570 locates the address of the metric memory 550 storing the path metric of the final stage on the basis of the position of the branch of the survivor path read out of the path memory 560, and then reads the path metric out of the determined address.

On the other hand, the decision circuit 520 receives the path metrics of the final stage from the Viterbi decoders 510–51N, estimates channel conditions on the basis of the individual path metrics, and then performs a signal decision. The result of signal decision is fed from the decision circuit 520 to the select circuit 530. In response, the select circuit 530 selects the correct one of the outputs of the Viterbi decoders 510–51N.

The operation of this embodiment will be described along with a procedure for estimating channel conditions. First, received symbols are sequentially applied to all the Viterbi decoders 510–51N each being assigned to a particular code rate. The decoders 510–51N each performs a trellis tracing with the input symbols at the code rate assigned thereto, and then outputs the resulting path and the path metric of the final stage. During trellis tracing, the ACS circuits 540 of the decoders 510–51N each sequentially determines branch metrics based on the received symbol, adds them to the previous metrics to produce path metrics, compares the path metrics, and sequentially selects the path having a smaller path metric. The metric memory 550 is sequentially updated by the path metrics. When another received symbol is input to each ACS circuit 460, the latest path metrics are read out of the metric memory 550 and fed back to the next trellis tracing.

The ACS circuit 540 repeats the trellis tracing with the path metrics fed back thereto. On the arrival of the last symbol, the ACS circuit 540 selects the path of the last stage, writes the path metric of the path selected in the metric memory 550, and writes the final survivor path in the path memory 560. Subsequently, the memory controller 570 traces back the survivor path stored in the path memory 560, thereby generating decoded bits. Also, the memory controller 570 detects the position where the branch of the final stage of the survivor path exists, and then generates the address of the metric memory 550 storing the path metric of the above branch. In this manner, all the Viterbi decoders 512–51N deliver their path metrics of the final stage to the decision circuit 520.

In response, the decision circuit 520 estimates channel conditions on the basis of the received path metrics and thereby estimates the error probability of the received signal. Then, the decision circuit 520 discards the results of decoding whose error probabilities are greater than the estimated probability, while selecting the result of decoding having the least error probability. Subsequently, the decision circuit 520 feeds a switching signal to the selecting circuit 530. In response, the selecting circuit 530 selects the most reliable decoded bits output from one of the Viterbi decoders 510–51N.

As stated above, this embodiment uses the final metrics of the final survivor paths as indexes for estimating the conditions of a communication channel. This successfully enhances accurate estimation without resorting to a special code for error detection. The above indexes may be used alone or in combination with conventional indexes in order to estimate a channel condition. As a result, the accuracy of estimation is improved to lower, e.g., the error frequency of signal decision.

Figure 13B:
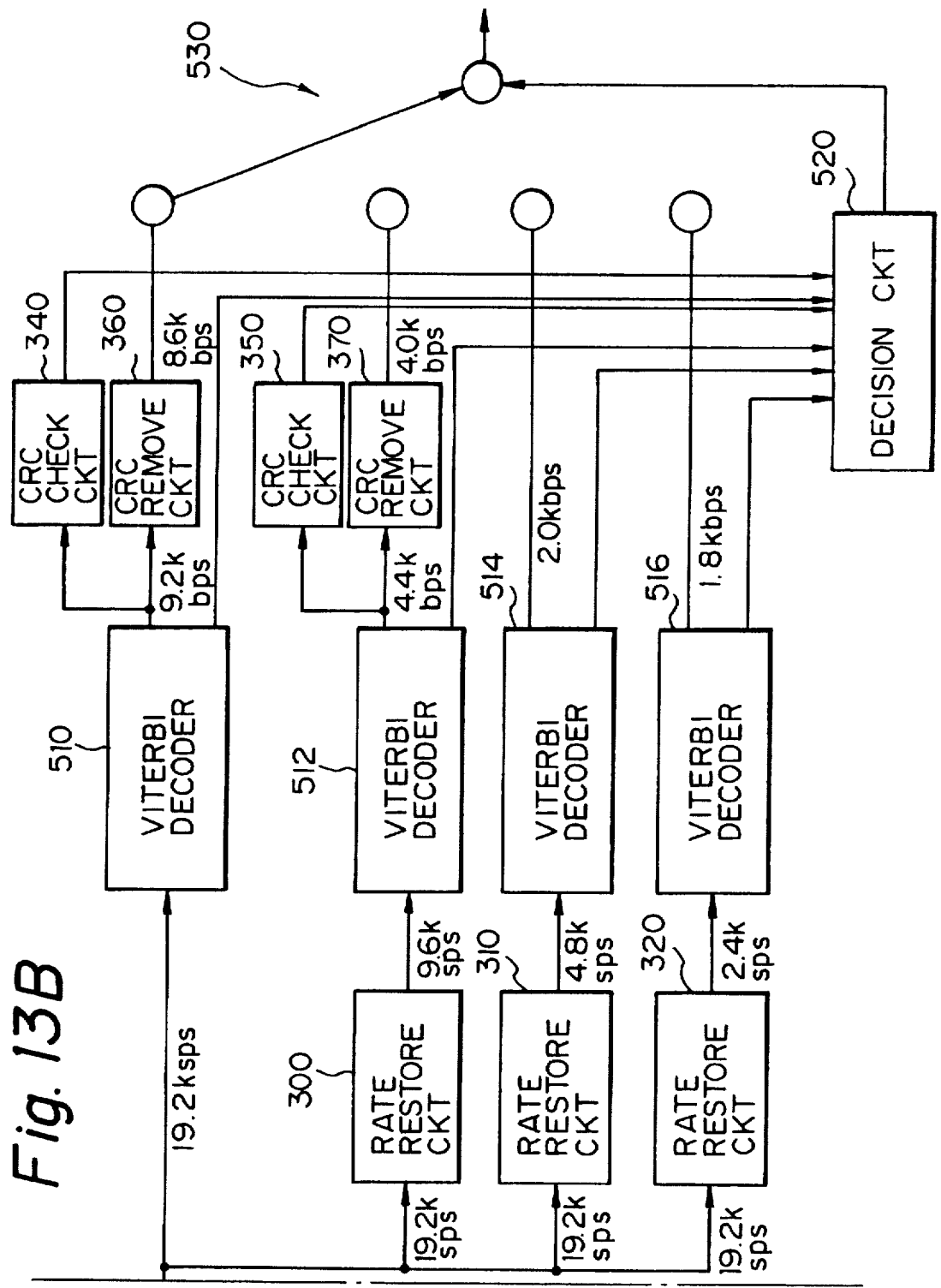

FIGS. 13A and 13B show a receiver including the signal decision device described with reference to FIG. 10. Again, assume that the receiver is applied to a North American CDMA handy phone by way of example. The receiver to be described receives a speech code having a code rate variable with a speech rate, effectively determines the code rate of the speech signal without resorting to any change in the specifications of the transmitter side, and then reproduces a speech, as in the previous embodiments. It follows that a transmitter for use with the receiver also has the configuration shown in FIGS. 5A and 5B and will not be described specifically. In FIGS. 13A and 13B, the same or similar constituent parts as or to the parts shown in FIGS. 4A, 4B, 9A and 9B are designated by the same reference numerals and will not be described in order to avoid redundancy.

The receiver of this embodiment differs from the previously described receivers in that it causes each of four Viterbi decoders 510, 512, 514 and 516 to produce the respective path metric of the last stage together with decoded bits, estimates channel conditions by referencing the path metrics, determines a code rate matching the channel conditions, and then switches the select circuit 530.

Specifically, the 19.2 kbps received signal output from the deinterleaving circuit 290 is directly applied to the first output Viterbi decoder 510. Also, the received signal is applied to the second, third and fourth Viterbi decoders 512, 514 and 516 via the first, second and third rate restore circuits 300, 310 and 320, respectively. The rate restore circuit 300 transforms the 19.2 kbps signal to a 9.6 ksps signal and feeds it to the Viterbi decoder 512. Likewise, the rate restore 310 transforms the input signal to a 4.8 ksps signal and feeds it to the Viterbi decoder 514. Further, the rate restore circuit 320 transforms the input signal to a 2.4 ksps signal and feeds it to the Viterbi decoder 516. The Viterbi decoders 510–516 are rate ½ decoders, and each performs a trellis tracing at a timing matching the respective code rate.

On receiving the 19.2 ksps symbols, the Viterbi decoder 510 performs a trellis tracing based on the Viterbi algorithm, sequentially selects the most probable paths, and then outputs 9.2 kbps decoded bits. At this instant, the Viterbi decoder 510 reads the path metric of the final stage of trellis tracing out of the metric memory 550 and feeds it to the decision circuit 520. Likewise, the Viterbi decoder 512 receiving the 9.6 ksps symbols outputs 4.4 kbps decoded bits, and feeds the path metric of the final bit to the decision circuit 520. Further, the Viterbi decoders 514 and 516 receiving the 4.8 ksps symbols and 2.4 ksps symbols, respectively, output 2.0 kbps and 0.8 kbps decoded bits, and each feeds the respective path metric of the final stage to the decision circuit 520.

The decision circuit 520 estimates channel conditions by referencing the path metrics of the last stage received from the Viterbi decoders 510–516, and selects a result of decoding matching the channel conditions. Then, the decision circuit 520 feeds a switching signal to the select circuit 530. In response, the select circuit 530 delivers the result of decoding output from one of the Viterbi decoders 510–516 selected to a voice decoder, not shown.

The decoded bits output from the first and second Viterbi decoders 510 and 512 are respectively subjected to error correction by the CRC check circuits 340 and 350, respectively, as in the previous embodiments. When the output of the Viterbi decoder 510 or 512 is selected, the CRC remove circuit 360 or 370 associated with the decoder 510 or 512 removes CRC bits from the decoded bits. At this instant, the CRC circuits 340 and 350 each delivers the respective error probability to the decision circuit 520. The decision circuit 520 selects decoded bits by referencing the error probabilities received from the CRC check circuits 340 and 350 and the path metrics of the last stage. However, this CRC error correction is not essential with the illustrative embodiment because the Viterbi decoders 510 and 512 execute error correction with the decoded bits by use of the Viterbi algorithm.

As stated above, the receiver of the illustrative embodiment estimates channel conditions on the basis of the path metrics of the last stage of the paths surviving after trellis tracing. As a result, accurate signal decision is enhanced to allow valid decoded bits to be produced. Further, because the path metrics of the last stage play the role of indexes, it is not necessary to add, e.g., a special error correcting code. Therefore, the receiver does not constrain the performance of the communication channel and does not require any change in the specifications of the transmitter side.

While the receiver of the embodiment, like the receivers of the previous embodiments, has been shown and described in relation to the North American CDMA system, it is similarly applicable to, e.g., a North American TDMA or similar TDMA handy phone. Although the Viterbi decoders 510–51N of the illustrative embodiment each has the specific configuration shown in FIG. 11, they may, of course, be provided with any other suitable configuration using the Viterbi algorithm and capable of reading the path metric of the last stage.

A further alternative embodiment of the signal decision device in accordance with the present invention will be described with reference to FIG. 14. This embodiment differs from the previous embodiments in that it causes convolutional encoders 620, 622, . . . , 62N to re-encode decoded bits output from Viterbi decoders 610, 612, . . . , 61N, respectively, estimates channel conditions by referencing the resulting symbol sequences and received symbols, and thereby detects a correct result of decoding. Particularly, the embodiment estimates channel conditions by a unique method consisting in multiplying each re-encoded symbol sequence by a constant, squaring a difference between the resulting product and a received symbol sequence, and determining the smallest one of the resulting values.

Figure 14:
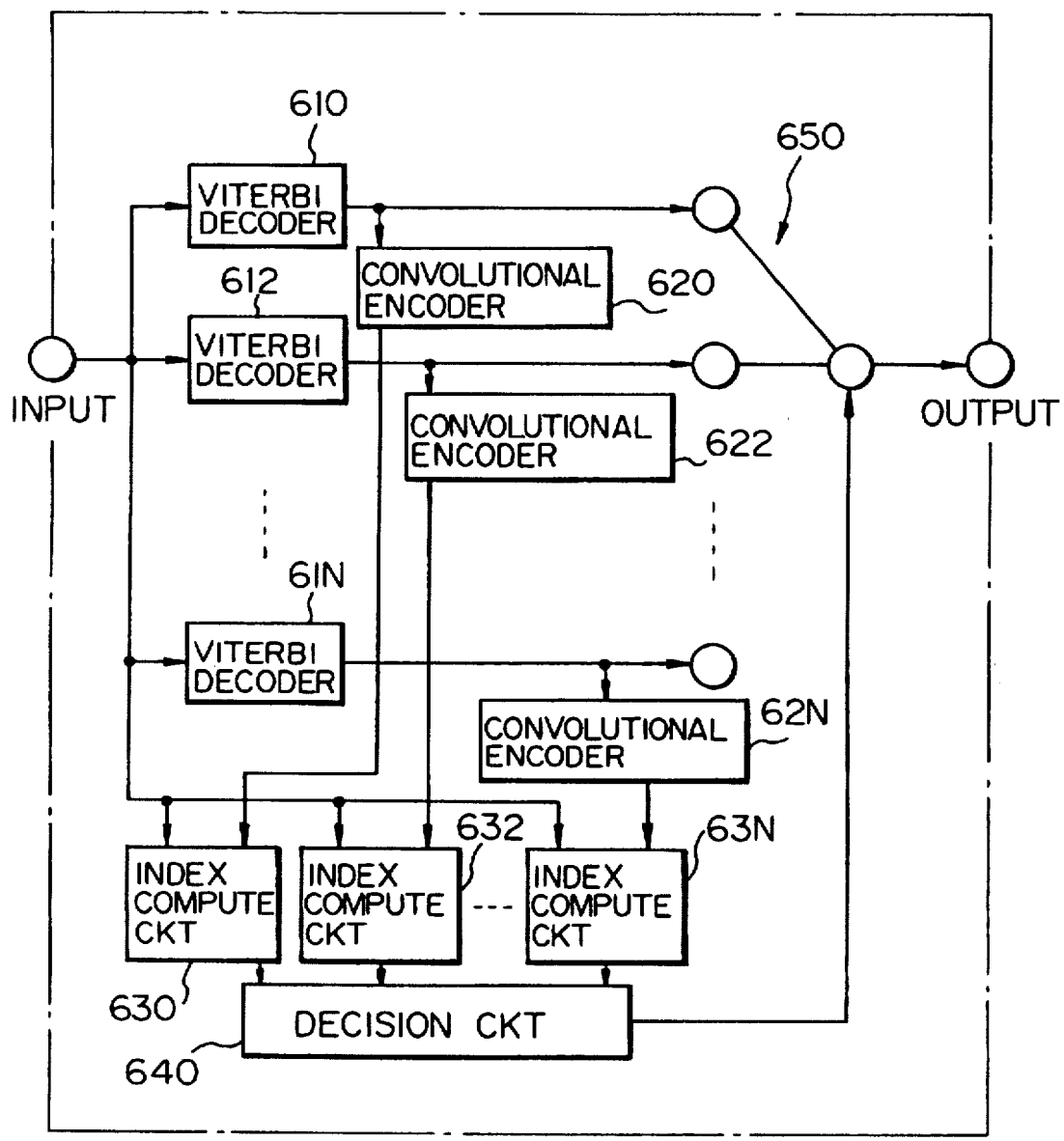
FIG. 14 is a block diagram schematically showing a further alternative embodiment of the present invention.

Specifically, as shown in FIG. 14, the signal decision device has a plurality of index compute circuits 630, 632, ..., 63N, a decision circuit 640, and a select circuit 650 in addition to the Viterbi decoders 610–61N and convolutional encoders 620–61N. The outputs of the Viterbi decoders 610–61N are connected to the select circuit 650 and connected to the convolutional encoders 620–62N, respectively. The outputs of the convolutional encoders 620–62N are connected to the index compute circuits 630–63N, respectively. A received input is fed not only to the Viterbi decoders 610–61N but also to the index compute circuits 630–63N. The outputs of the index compute circuits 630–63N are connected to the decision circuit 640.

The Viterbi decoders 610–61N each has a particular decoding rate matching a coding rate and has a conventional configuration including an ACS circuit, a metric memory, and a path memory, as in the previous embodiments. The convolutional encoders 620–62N respectively transform decoded bits output from the Viterbi decoders 610–61N to convolutional codes, and each has a coding rate matching the decoding rate of the associated Viterbi decoder. The convolutional encoders 620–62N, like convolutional encoders included in a transmitter, are implemented by a plurality of shift registers each being assigned to a particular code rate, Exclusive OR gates or similar logic circuits, etc.

The index compute circuits 630–63N unique to this embodiment receives estimated symbol sequences from the convolutional encoders 620–62N and received symbols input to the Viterbi decoders 610–61N, respectively. In response, the circuits 630–63N each produces an index for estimating channel conditions. Assuming that a received symbol sequence and an estimated symbol sequence are Xi and Yi, respectively, then estimated noise energy ENE is expressed as:

$$ENE = \Sigma(Xi - aYi)^2 \qquad \text{Eq. (6)}$$

where a denotes a suitable gain given to the estimated symbol Yi.

Let the least noise energy of the estimated noise energy ENE be labeled LNE. Then, the least noise energy LNE for the gain a is produced from the Eq. (6) by:

$$LNE = \min_a (ENE) \qquad \text{Eq. (7)}$$

By solving d(ENE)/da=0 for a, there is produced:

$$LNE = E_{XX} - E_{XY}^2 / E_{YY} \qquad \text{Eq. (8)}$$

where $E_{XX} = \Sigma Xi^2$, $E_{XY} = \Sigma Xi \cdot Yi$, and $E_{YY} = \Sigma Yi^2$.

It may therefore be said that as the estimated least noise energy LNE decreases, the channel conditions grow better. For example, assume that the communication channel is practically free from noise, and that the received symbol and estimated symbol are identical except for the gain. Then, the estimated least noise energy LNE is zero. The illustrative embodiment estimates channel conditions by using the estimated least noise energy LNE produced by the Eq. (8) as an index.

Figure 15:
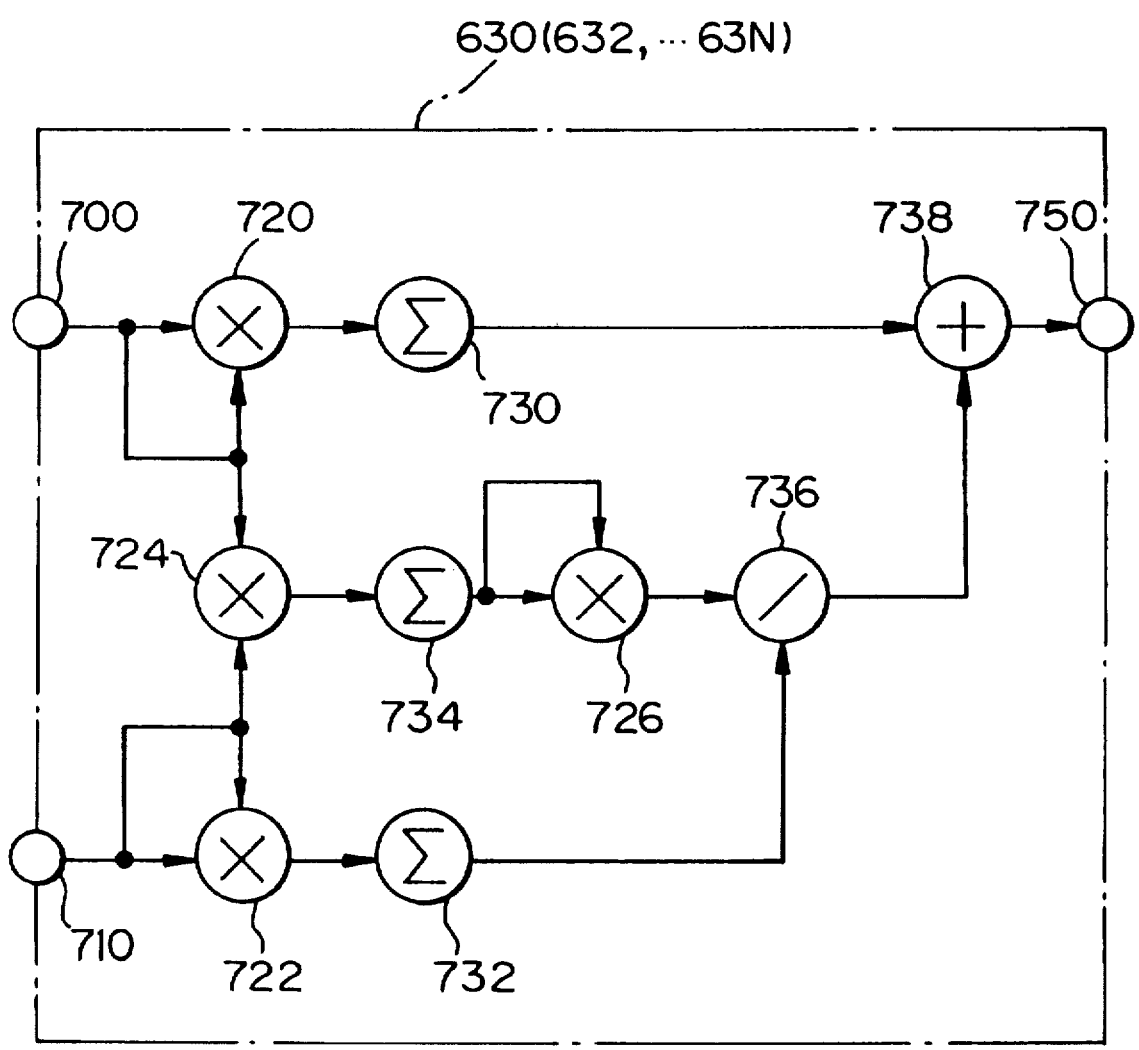
FIG. 15 is a block diagram schematically showing a specific configuration of an index computing circuit included in the embodiment of FIG. 14.

As shown in FIG. 15, the index compute circuits 630–63N each has a first input terminal 700, a second input terminal 710, a plurality of multipliers 720–726, a plurality of totalizers 730–734, a divider 736, a subtracter 738, and an output terminal 750. A received symbol sequence Xi and a re-encoded estimated symbol sequence Yi are applied to the input terminals 700 and 710, respectively. The output of the subtracter 738, i.e., an index is fed out via the output terminal 750.

The first multiplier 720 sequentially squares received symbols Xi coming in through the first input terminal 710. Likewise, the second multiplier 722 sequentially squares estimated symbols Yi coming in through the second input terminal 712. The third multiplier 724 produces a product of the symbols Xi and Yi input via the input terminals 710 and 712, respectively. The first totalizer 730 totalizes the outputs of the multiplier 720 in order to produce $E_{XX} = \Sigma Xi^2$ included in the Eq. (8). The second totalizer 732 totalizes the outputs of the multiplier 722 in order to produce $E_{YY} = \Sigma Yi^2$. The third totalizer 734 totalizes the outputs of the multiplier 724 in order to produce $E_{XY} = \Sigma Xi \cdot Yi$. The fourth multiplier 726 squares the output of the third totalizer 734 in order to produce $E_{XY}^2$. The divider 736 divides the output of the multiplier 734 by the output of the totalizer 732, thereby producing $E_{XY}^2 / E_{YY}$. The subtracter 738 subtracts the output of the divider 736 from the output of the totalizer 730 in order to produce an index.

Referring again to FIG. 14, the decision circuit 640 estimates channel conditions on the basis of the estimated least noise energy LNE output from each of the index compute circuits 630–63N. The decision circuit 640 determines, based on the estimated channel conditions, which estimated symbols are correct, i.e., which re-encoded symbols are accurate. Then, the decision circuit 640 feeds a switching signal to the select circuit 650. In response, the select circuit 650 selects decoded bits output from one of the Viterbi decoders 610–61N designated by the switching signal.

The operation of the the illustrative embodiment will be described along with the channel condition estimating method particular thereto. First, received symbols are sequentially applied to all the Viterbi decoders 610–61N each being assigned to a particular code rate and the index compute circuits 630–63N. The Viterbi decoders 610–61N each performs a trellis tracing with the input symbols at the respective code rate, detects the most probable path, and traces back the most probable path to produce decoded bits. The decoded bits are fed to the associated one of the convolutional encoders 620–62N.

On receiving the decoded bits, the convolutional encoders 620–62N each transforms them to a convolutional code at the respective coding rate and thereby generates re-encoded estimated symbols. The estimated symbols are sequentially fed to the associated one of the index compute circuits 630–63N. The index compute circuits 630–63N each produces an index for channel condition estimation from the received symbols Xi and the estimated symbols Yi output from the associated one of the convolutional encoders 620–62N.

Specifically, in each of the index compute circuits 630–63N, the multiplier 720 and totalizer 730 cooperate to produce the total $\Sigma Xi^2 = E_{XX}$ of the squares of the received symbols Xi that come in through the first input terminal 710. Likewise, the multiplier 722 and totalizer 730 produce the total $\Sigma Yi^2 = E_{YY}$ of the squares of the estimated symbols Yi that come in through the input terminal 712. The multipliers 724 and 726 and totalizers 734 cooperate to produce a square $(\Sigma Xi \cdot Yi)^2 = E_{XY}^2$ of the total of the products of the received symbols Xi and estimated symbols Yi. Subsequently, the divider 736 divides the output $E_{XY}^2$ of the multiplier 726 by the output $E_{YY}$ of the totalizer 732 to produce $E_{XY}^2 / E_{YY}$. The subtracter 738 subtracts $E_{XY}^2 / E_{YY}$ from the output $E_{XX}$ of the totalizer 730 and produces the resulting difference on the output terminal 740. The output of the subtracter 738 is representative of the least energy LNE of the individual estimated noise, i.e., $LNE = E_{XX} - E_{XY}^2 / E_{YY}$ and fed to the decision circuit 640 as an index.

The decision circuit 640 estimates channel conditions on the basis of the indexes received from the index compute circuits 630–63N, and then estimates an error probability of the received signal. Subsequently, the decision circuit 640 discards the results of decoding having error probabilities greater than the estimated probability, selects the result of decoding lowest in error probability, and then feeds a switching signal to the select circuit 650. In response, the select circuit 640 selects decoded bits output from one of the Viterbi decoders 610–61N designated by the switching signal.

As stated above, the embodiment uses a new index representative of minimum estimated noise energy. This enhances accurate estimation and thereby reduces, e.g., the error frequency of signal decision without adding any error correcting code or by combining the index with an error correcting code.

Figure 16B:
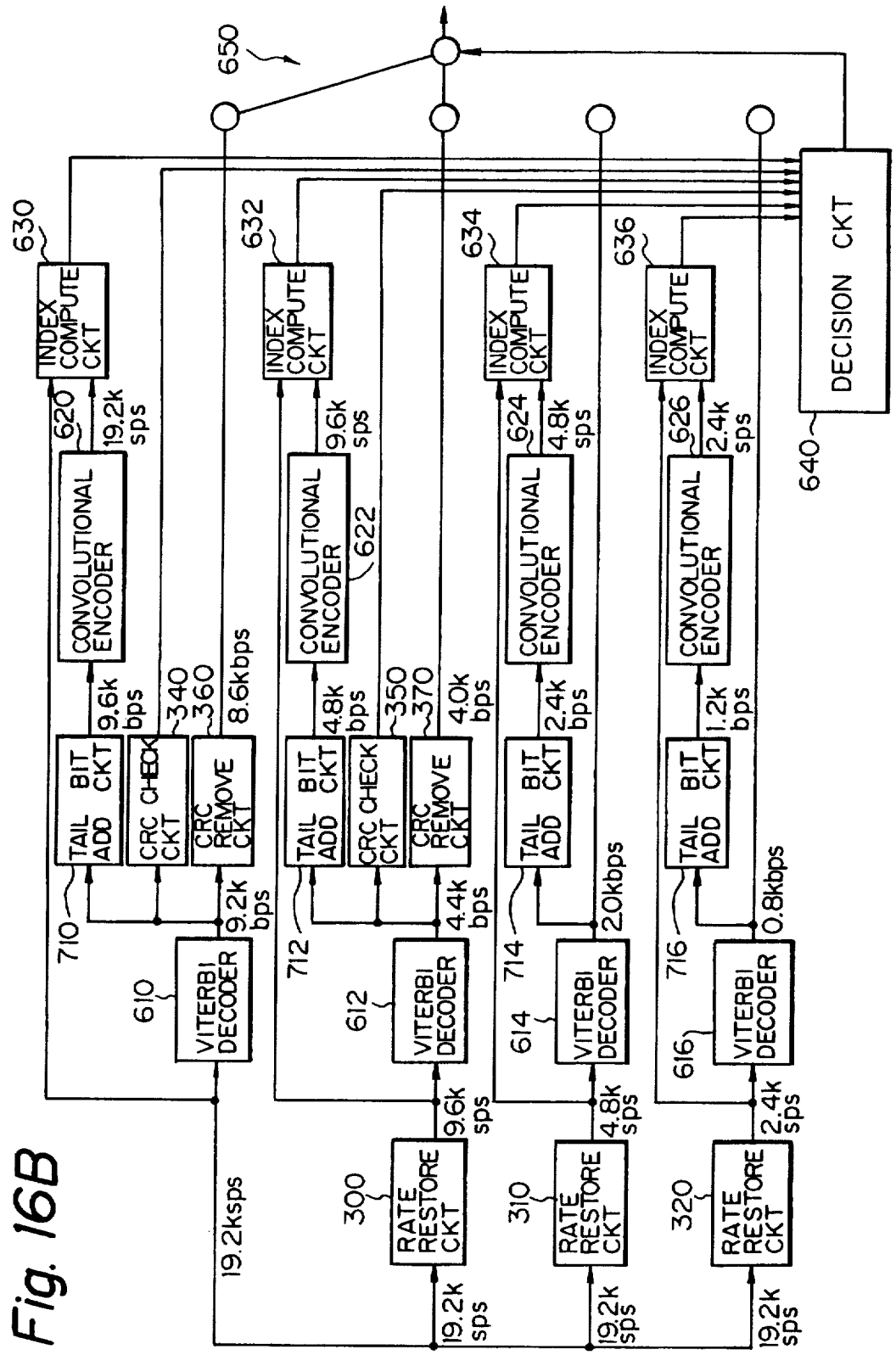

FIGS. 16A and 16B show a receiver including the signal decision circuitry shown in FIG. 14. The receiver, like the previous receivers, is applied to the North American CDMA handy phone by way of example. A transmitter matching the receiver also has the configuration shown in FIGS. 5A and 5B. The constituent parts of the receiver identical with the parts of the previous embodiments are designated by the identical reference numerals and will not be described in order to avoid redundancy.

Briefly, the receiver of this embodiment differs from the previous receivers in that it causes four convolutional decoders 620, 622, 622 and 624 to re-encode the outputs of the Viterbi decoders 610, 612, 614 and 616, respectively, computes new indexes by using the resulting convolutional codes and symbols input to the decoders 610–616, estimates channel conditions on the basis of the indexes, and thereby executes a decision.

Specifically, as shown in FIGS. 16A and 16B, the 19.2 kbps received symbols output from the deinterleaver 290 are directly applied to the first output Viterbi decoder 610 and applied to the first index compute circuit 630. Also, the received symbols are applied to the first, second and third rate restore circuits 300, 310 and 320. The rate restore circuit 300 transforms the 19.2 kbps symbols to 9.6 ksps symbols and feeds them to the Viterbi decoder 612 and the second index compute circuit 632. Likewise, the rate restore circuit 310 transforms the input symbols to 4.8 ksps symbols and feeds them to the Viterbi decoder 6 and third index compute circuit 634. Further, the rate restore circuit 320 transforms the input symbols to 2.4 ksps symbols and feeds them to the Viterbi decoder 616 and fourth index compute circuit 636.

The Viterbi decoders 610–616 are rate ½ decoders, and each performs a trellis tracing at a timing matching the respective code rate. On receiving the 19.2 ksps symbols, the Viterbi decoder 610 decodes them to output 9.2 kbps decoded bits. Likewise, the Viterbi decoder 612 decodes the 9.6 ksps symbols to output 4.4 kbps decoded bits. Further, the Viterbi decoders 614 and 616 respectively decode the 4.8 ksps symbols and 2.4 ksps symbols to output 2.0 kbps decoded bits and 0.8 kbps decoded bits. Tail bit add circuits 710–716 respectively add tail bits for convolutional coding to the decoded bits output from the Viterbi decoders 610–616. As a result, 9.6 kbps, 4.8 kbps, 2.4 kbps and 1.2 kbps signals are fed from the tail bit adding circuits 710–716 to the convolutional encoders 620–626, respectively The convolutional encoders 620–626 are rate ½ encoders operable in the same manner as the convolutional encoders included in the transmitter. Specifically, the encoder 620 re-encodes the 9.6 kbps signal to output 19.2 ksps estimated symbols while the encoder 622 re-encodes the 4.8 kbps signal to output 9.6 ksps symbols. Likewise, the encoders 624 and 626 respectively re-encode the 2.4 kbps and 1.2 kbps signals to 4.8 ksps and 2.4 ksps estimated symbols. The estimated symbols are respectively fed from the encoders 620–626 to the index compute circuits 630–636.

The index compute circuits 630–636 each produces an index, i.e., the estimated least noise energy LNE derived from the total of the squares of the differences between the received symbols and the re-encoded estimated symbols, as stated earlier. Specifically, the circuit 630 outputs the estimated least noise energy LNE based on the 19.2 ksps estimated symbols and received symbols. Likewise, the circuit 632 outputs the estimated least noise energy LNE based on the 9.6 ksps estimated symbols and received symbols. The circuits 634 and 636 respectively output the estimated least noise energy LNE based on the 4.8 ksps and 2.4 ksps estimated symbols and received symbols. The noise energy LNE output from each of the circuits 630–636 is fed to the decision circuit 640.

The decision circuit 640 estimates channel conditions by using the estimated least noise energy LNE received from the index computing circuits 630–636, and then selects a result of decoding matching the estimated channel conditions. The decision circuit 640 causes the select circuit 650 to select a correct result of decoding output from one of the Viterbi decoders 610–614. The correct result of decoding is delivered to a voice decoder, not shown.

The decoded bits output from the first and second Viterbi decoders 610 and 612 are respectively subjected to error correction by the CRC check circuits 340 and 350, respectively, as in the previous embodiments. When the output of the Viterbi decoder 610 or 612 is selected, the CRC remove circuit 360 or 370 associated with the decoder 610 or 612 removes CRC check bits from the decoded bits. At this instant, the CRC check circuits 340 and 350 each delivers the respective error probability to the decision circuit 520. The decision circuit 520 selects decoded bits by referencing the error probabilities received from the CRC check circuits 340 and 350 and the path metrics of the last stage.

As stated above, the illustrative embodiment produces estimated least noise energy from the total of squares of differences between received symbols and re-encoded estimated symbols, and then estimates channel conditions by using the least noise energy as a new index. The embodiment is therefore capable of achieving effective decoded bits by accurate signal decision. In addition, because the embodiment does not have to add, e.g., an error detecting code to the new index, it does not constrain the performance of the communication channel and does not require any change in the specifications of the transmitter side.

Figure 17:
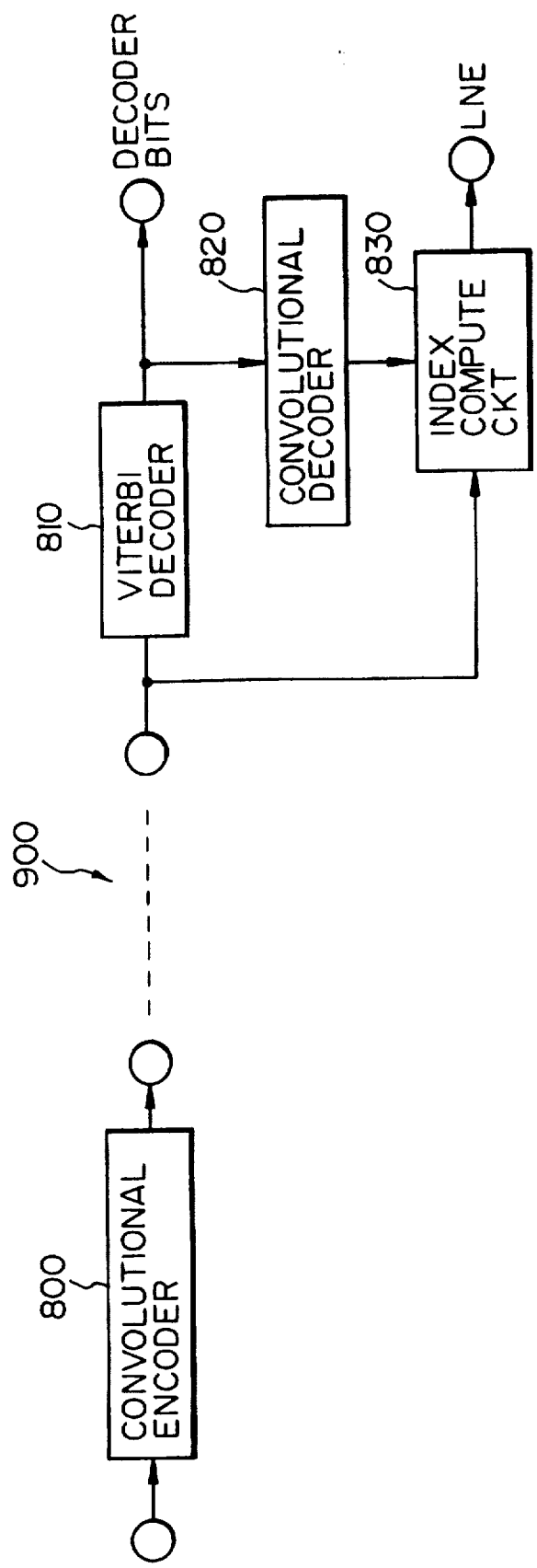
FIG. 17 is a block diagram schematically showing another configuration of a communication system including a receiver with which a channel condition estimating method of the present invention is practicable.

While the embodiment has concentrated on the North American CDMA system, it is similarly applicable to a North American TDMA or similar TDMA handy phone. The embodiment is implemented as signal decision circuitry and a receiver capable of determining a plurality of code rates. Alternatively, the channel estimation procedure is practicable even when signals are interchanged at a single code rate, as shown in FIG. 17 specifically. In FIG. 17, a transmitter has a convolutional encoder 800 for generating a signal in the form of a convolutional code. The signal is sent from the transmitter to a receiver over a suitable channel 900. The receiver has a Viterbi decoder 810 for decoding the received convolutional code. The resulting decoded bits are re-encoded by a convolutional encoder 820 identical in code rate with the encoder 800. An index compute circuit 830 produces the estimated least noise energy based on the estimated symbols derived from the output of the encoder 820 and the received symbols, thereby estimating the conditions of the channel 900. The estimated channel conditions may be used to confirm the reliability of the received signal or as an index for power control, as desired.

In summary, it will be seen that the present invention provides a method and a device for signal decision, a receiver, and a channel condition estimating method for a coding communication system and practicable without resorting to an error detecting code for the estimation of channel conditions. This successfully obviates an overhead relating to a communication channel. In addition, even with any of the communication systems recommended in the past, the present invention achieves more accurate signal decision without resorting to any change in the specifications of a transmitting station if it is combined with the result of signal decision using an error correcting code particular to the communication system.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A signal decision device for a coding communication system and for identifying a code rate of a received signal encoded at any one of a plurality of code rates including a convolutional code rate, said device comprising:

a plurality of Viterbi decoding means for respectively performing trellis tracings with said received signal in accordance with the plurality of code rates to thereby output a plurality of decoded signal each having a particular code rate;

an M break-off means for sequentially receiving a plurality of path metrics sequentially detected by said plurality of Viterbi decoding means during the trellis tracings, and sequentially breaking off the trellis tracings of, among said plurality of path metrics, unlikely paths to thereby detect M most probable paths over at least two of said plurality of Viterbi decoding means, where M is a natural number; and a decision means for performing a final decision with the path metrics of said M paths to thereby determine which of said decoded signals output from said plurality of Viterbi decoding means has a correct code rate.

2. A device in accordance with claim 1, wherein said plurality of Viterbi decoding means each comprises:

an adding, comparing and selecting (ACS) means for sequentially determining branch metrics based on the received signal branch by branch during the trellis tracing, sequentially adding said branch metrics to last branch metrics, comparing resulting path metrics, and sequentially selecting one path smaller in path metric than the other path;

a metric storing means for sequentially updating the path metrics of the path selected by said ACS means branch by branch, and feeding said path metrics to said ACS circuit; and a path storing means for sequentially updating a survivor path selected by said ACS means;

wherein said ACS means and said metric storing means are both connected to an input side of said M break-off means, wherein said path storing means is connected to an output side of said M break-off means, and wherein said M break-off means compares the path metrics received from the said ACS means of said plurality of Viterbi decoding means, causes, among said path metrics, likely path metrics to be sequentially written to the respective metric storing means, narrows down said paths to M paths by recursive path selection, causes said M paths to be written to the respective path storing means, and feeds the path metrics of said M paths to said decision means.

3. A device in accordance with claim 1, wherein when said M break-off means performs an M break-off over at least two of said plurality of Viterbi decoding means, said M break-off means causes one of said plurality of Viterbi decoding means lost a survivor path to end the trellis tracing while causing the other Viterbi decoding means having survivor paths to continue the trellis tracings.

4. A device in accordance with claim 1, wherein the received signal is a signal encoded by any one of a plurality of convolutional encoders each having a particular code rate, wherein said plurality of Viterbi decoding means each decodes the received signal at a respective rate corresponding to the code rate of one of said plurality of convolutional encoders, and wherein said decision means determines which of said decoded signals output from said plurality of Viterbi decoding means is correct to thereby identify the code rate.

5. A device in accordance with claim 1, wherein the received signal consists of a plurality of signals having respective bit rates and transformed to corresponding convolutional codes and then repeated to have a single symbol rate, wherein said device further comprises a plurality of rate restoring means for restoring symbols having a plurality of symbol rates from the received signal, wherein said plurality of Viterbi decoding means are respectively connected to said plurality of rate restoring means and respectively perform the trellis tracings in accordance with said plurality of symbol rates to thereby decode the plurality of signals having the respective bit rates, and wherein said decision means determines which of the decoded signals output from said plurality of Viterbi decoding means is correct to thereby identify the bit rate of the received signal.

6. A signal decision device for a coding communication system and for identifying a code rate of a received signal encoded at any one of a plurality of code rates including a convolutional code rate, said device comprising:

a plurality of soft output Viterbi decoding means for respectively performing trellis tracings with said received signal in accordance with the plurality of code rates to thereby decode said received signal to a plurality of signal each having a particular code rate, and for outputting together with said plurality of signals reliability information representative of a likelihood of said plurality of signals; and a decision means for determining, based on said reliability information received from said plurality of soft output Viterbi decoding means, which of said plurality of signals is correct.

7. A device in accordance with claim 6, wherein said plurality of soft output Viterbi decoding means each comprises:

an ACS means for sequentially determining, based on the received signal, branch metrics branch by branch during the trellis tracing, sequentially adding said branch metrics to last branch metrics, comparing resulting path metrics, and sequentially selecting one path smaller in path metric than the other path, and for sequentially outputting differences between greatest path metrics and smallest path metrics branch by branch;

a metric storing means for sequentially updating the path metrics of the paths selected by said ACS means branch by branch, and feeding said path metrics to said ACS means; and a path storing means for sequentially updating survivor paths selected by said ACS means and said reliability information based on a difference between the path metrics of said paths and representative of likelihood of said paths;

wherein said path storing means includes a path updating means for producing, when the paths to be updated include a path different from previous paths, said reliability information based on the difference between the greatest branch metric and the smallest branch metric at each branch and output from said ACS means.

8. A device in accordance with claim 7, wherein the received signal is a signal encoded by any one of a plurality of convolutional encoders each having a particular code rate, wherein said plurality of soft output Viterbi decoding means each decodes the received signal at a respective rate corresponding to the code rate of one of said plurality of convolutional encoders, and wherein said decision means determines which of said plurality of signals output from said plurality of soft output Viterbi decoding means is correct to thereby identify the code rate of the received signal.

9. A device in accordance with claim 7, wherein the received signal consists of a plurality of signals having respective bit rates and transformed to corresponding convolutional codes and then repeated to have a single symbol rate, wherein said device further comprises a plurality of rate restoring means for restoring symbols having a plurality of symbol rates from the received signal, wherein said plurality of soft output Viterbi decoding means are respectively connected to said plurality of rate restoring means and respectively perform the trellis tracings in accordance with said plurality of symbol rates to thereby decode the plurality of signals having the respective bit rates, and wherein said decision means determines which of the decoded signals output from said plurality of soft output Viterbi decoding means is correct to thereby identify the bit rate of the received signal.

10. A signal decision device for a coding communication system and for identifying a code rate of a received signal encoded at any one of a plurality of code rates including a convolutional code rate and received on a channel, said device comprising:

a plurality of Viterbi decoding means for respectively performing trellis trackings with said received signal in accordance with the plurality of code rates to thereby decode said received signal to a plurality of signals each having a particular code rate; and a decision means for receiving path metrics of a last stage of survivor paths surviving after the trellis tracings performed by said plurality of Viterbi decoding means, and estimating channel conditions of the channel based on said path metrics to thereby determine which of said plurality of signals output from said plurality of Viterbi decoding means is correct.

11. A device in accordance with claim 10, wherein said plurality of Viterbi decoding means each comprises:

an ACS means for sequentially determining, based on the received signal, branch metrics branch by branch during the trellis tracing, sequentially adding said branch metrics to last branch metrics, comparing resulting path metrics, and sequentially selecting one path which is smaller in path metric than the other path;

a metric storing means for sequentially storing the path metrics selected by said ACS means branch by branch, and sequentially feeding previous path metrics to said ACS means;

a path storing means for sequentially updating the paths selected by said ACS means; and a control means for detecting a survivor path stored in said path storing means, and for reading the path metric of the last stage of said survivor path out of said metric storing means.

12. A device in accordance with claim 10, wherein the received signal is a signal encoded by any one of a plurality of convolutional encoders each having a particular code rate, wherein said plurality of Viterbi decoding means each decodes the received signal at a respective rate corresponding to the code rate of one of said plurality of convolutional encoders, and wherein said decision means determines which of said plurality of signals output from said plurality of Viterbi decoding means is correct to thereby identify the code rate of the received signal.

13. A device in accordance with claim 10, wherein the received signal consists of a plurality of signals having respective bit rates and transformed to corresponding convolutional codes and then repeated to have a single symbol rate, wherein said device further comprises a plurality of rate restoring means for restoring symbols having a plurality of symbol rates from the received signal, wherein said plurality of Viterbi decoding means are respectively connected to said plurality of rate restoring means and respectively perform the trellis tracings in accordance with said plurality of symbol rates to thereby decode the plurality of signals having the respective bit rates, and wherein said decision means determines which of the decoded signals output from said plurality of Viterbi decoding means is correct to thereby identify the bit rate of the received signal.

14. A signal decision device for a coding communication system and for identifying a code rate of a received signal encoded at any one of a plurality of code rates including a convolutional code rate and received on a channel, said device comprising:

a plurality of Viterbi decoding means for respectively performing trellis tracings with said received signal in accordance with the plurality of code rates to thereby decode said received signal to a plurality of signals each having a particular code rate;

a plurality of re-encoding means for respectively re-encoding said plurality of signals output from said plurality of Viterbi decoding means to corresponding convolutional codes; and a plurality of decision means for respectively performing signal decisions based on said convolutional codes output from said plurality of re-encoding means and said received signal;

wherein said plurality of decision means respectively receive re-encoded symbol sequences from said plurality of re-encoding means and a received symbol sequence input to said plurality of Viterbi decoding means, multiply said re-encoded symbol sequences by a constant to produce products, produce differences between said products and the received symbol sequence, square said differences to produce squares, totalize said squares to produce totals, determine a smallest total of the totals produced, and estimate channel conditions of the channel based on said smallest total to thereby determine which of said plurality of signals output from said plurality of Viterbi decoding means is correct.

15. A device in accordance with claim 14, wherein the received signal is a signal encoded by any one of a plurality of convolutional encoders each having a particular code rate, wherein said plurality of Viterbi decoding means each decodes the received signal at a respective rate corresponding to the code rate of one of said plurality of convolutional encoders, and wherein said decision means determines which of said plurality of signals output from said plurality of Viterbi decoding means is correct to thereby identify the code rate of the received signal.

16. A device in accordance with claim 15, wherein the received signal consists of a speech signal transformed to a first convolutional code at a first code rate, and a control signal transformed to a second convolutional code at a second code rate different from said first code rate, wherein the first and second convolutional codes are selectively located at a same position of a slot, wherein said plurality of Viterbi decoding means include at least a first Viterbi decoding means for decoding the received signal at the first code rate, and a second Viterbi decoding means for decoding the received signal at the second code rate, and wherein said plurality of decision means determine which of signals output from said first and second Viterbi decoding means is correct to thereby determine whether the received signal is the speech signal or the control signal.

17. A device in accordance with claim 14, wherein said received signal consists of a plurality of signals having respective bit rates and transformed to corresponding convolutional codes and then repeated to have a single symbol rate, wherein said device further comprises a plurality of rate restoring means for restoring symbols having a plurality of symbol rates from said received signal by addition, wherein said plurality of Viterbi decoding means are respectively connected to said plurality of rate restoring means and respectively perform the trellis tracings in accordance with said plurality of symbol rates to therby decode the plurality of signals having the respective bit rates, and wherein said decision means determines which of the decoded signals output from said plurality of Viterbi decoding means is correct to thereby identify the bit rate of said received signal.

18. A signals deciding method for a coding communication system and for identifying a code rate of a received signal encoded at any one of a plurality of code rates including a convolutional code rate, said method comprising the step of:

(a) performing trellis tracings with said received signal in accordance with the plurality of code rates to thereby decode said received signal to a plurality of signals having a particular code rate;

(b) sequentially receiving a plurality of path metrics sequentially detected by the trellis tracings in step (a), and sequentially breaking off the trellis tracings of, among said plurality of path metrics unlikely paths to thereby detect M most probable paths over at least two of said trellis tracings, where M is a natural number; and (c) executing a final decision with path metrics of said M paths detected in step (b) to thereby identify the code rate of said received signal.

19. A method in accordance with claim 18, wherein step (a) comprises:

(d) sequentially producing branch metrics of each trellis tracing on the basis of the received signal;

(e) sequentially adding said branch metrics to branch metrics produced at a previous branch to thereby output added branch metrics;

(f) comparing said added branch metrics;

(g) sequentially selecting paths having a smaller path metric; and (h) sequentially storing survivor paths selected in step (g) while updating said survivor paths; and wherein step (b) comprises:

(i) comparing the path metrics of the paths selected in step (g), feeding, among said path metrics, probable path metrics to step (e), repeating step (g) to thereby narrow down the paths to M paths, storing said M paths in step (h), and feeding the path metrics of said M paths to step (c).

20. A method in accordance with claim 18, wherein step (b) comprises (j) ending, in the event of an M break-off, the trellis tracing lost a survivor path while continuing the trellis tracing having a survivor path.

21. A method in accordance with claim 18, wherein the received signal is a signal encoded by one of a plurality of convolutional encoders each having a particular convolution rate, and wherein step (a) is executed with the received signal at rates corresponding to said plurality of convolutional encoders in parallel to thereby determine which result is correct, whereby the code rate of the received signal is identified.

22. A method in accordance with claim 18, wherein the received signal is a signal produced by transforming signals having a plurality of bit rates and encoded by variable rate speech encoding to corresponding convolutional codes, and then repeated to having a single rate, wherein said method further comprises the step of (k) restoring code data having a plurality of rates from the received signal by addition, and wherein step (a) comprises a plurality of steps for executing in parallel trellis tracings each corresponding to a respective bit rate restored in step (k) to thereby determine which result is correct, whereby the bit rate of the received signal is identified.

23. A signal deciding method for a coding communication system and for identifying a code rate of a received signal encoded at any one of a plurality of code rates including a convolutional code rate, said method comprising the steps of:

(a) executing trellis tracings each corresponding to one of the plurality of code rates to thereby decode the received signal to a plurality of signals each having a particular code rate, and outputting reliability information each being representative of a probability of the signal; and (b) determining, based on said reliability information, which of said signals output in step (a) is correct.

24. A method in accordance with claim 23, wherein step (a) comprises:

(c) sequentially producing, based on the received signal, branch metrics of the trellis tracings branch by branch;

(d) sequentially adding said branch metrics to branch metrics produced at a previous branch to thereby output added branch metrics;

(e) comparing said added branch metrics;

(f) sequentially selecting paths having a smaller path metric;

(g) producing a difference between a greatest path metric and a smallest path metric at each of consecutive branches; and (h) sequentially storing said paths selected in step (f) and said reliability information on said paths while updating said paths and said reliability information; and wherein said step (h) comprises (i) determining, when the path to be updated is different from a previous path, the reliability information on said path on the basis of the difference between the greatest path metric and the smallest path metric produced in step (g), and storing said reliability information.

25. A method in accordance with claim 23, wherein the received signal is a signal encoded by one of a plurality of convolutional encoders each having a particular convolution rate, and wherein step (a) is executed with the received signal at rates corresponding to said plurality of convolutional encoders in parallel to thereby determine which result is correct, whereby the code rate of the received signal is identified.

26. A method in accordance with claim 25, wherein the received signal consists of a speech signal encoded to a convolutional code at a first code rate, and a control signal encoded to a convolutional code at a second code rate different from said first code rate, wherein the speech signal and the control signal are selectively located at a single position of a slot to be transmitted, and wherein step (a) comprises (j) executing trellis tracings with the received signal at the first code rate, and (k) executing trellis tracings with the received signal at the second code rate, and wherein said method determines which of results of steps (j) and (k) is correct to thereby identify the speech signal or the control signal.

27. A method in accordance with claim 23, wherein the received signal is a signal produced by transforming signals having a plurality of bit rates and encoded by variable rate speech encoding to corresponding convolutional codes, and then repeated to having a single rate, wherein said method further comprises the step of (k) restoring code data having a plurality of rates from the received signal by addition, and wherein step (a) comprises a plurality of steps for executing in parallel trellis tracings each corresponding to a respective bit rate restored in step (k) to thereby determine which result is correct, whereby the bit rate of the received signal is identified.

28. A channel condition estimating method for estimating channel conditions of a channel in the event of identification of a code rate of a received signal encoded at any one of a plurality of code rates including a convolutional code rate and received on the channel, said method comprising the steps of:

(a) executing trellis tracings each corresponding to one of the plurality of code rates to thereby decode said received signal to a plurality of signals each having a particular code rate;

(b) detecting path metrics of last stages of paths surviving after the trellis tracings; and (c) determining error probabilities of said plurality of signals output in step (a) by using said path metrics as indexes to thereby estimate the channel conditions.

29. A method in accordance with claim 28, wherein the received signal is a signal encoded by one of a plurality of convolutional encoders each having a particular convolution code rate, and wherein step (a) is executed with the received signal at rates corresponding to said plurality of convolutional encoders in parallel to thereby determine which result is correct, whereby the code rate of the received signal is identified.

30. A method in accordance with claim 28, wherein the received signal consists of a plurality of signals having respective bit rates and transformed to corresponding convolutional codes and then repeated to have a single symbol rate, wherein said method further comprises the step of (d) decoding said received signal to a plurality of coded data each having a particular rate by addition, and wherein step (a) comprises a plurality of substeps each performing in parallel to another the trellis tracing in accordance with a respective one of the bit rates of said plurality of coded data, and wherein the method determines which results of said plurality of substeps is correct to thereby identify the bit rate of said received signal.

31. A channel condition estimating method for estimating channel conditions of a channel in the event of identification of a code rate of a received signal encoded at any one of a plurality of code rates including a convolutional code rate and received on the channel, for thereby executing a signal decision, said method comprising the steps of:

(a) executing trellis tracings each corresponding to one of the plurality of code rates to thereby decode said received signal to a plurality of signals each having a particular code rate;

(b) re-encoding said plurality of signals produced in step (a) to output corresponding convolutional codes; and (c) executing a signal decision on the basis of said convolutional codes produced in step (b) and said received signal;

wherein step (c) comprises (d) multiplying symbol sequences of said convolutional codes output in step (b) by a constant to produce products, producing differences between said products and a symbol sequence of said received signal, squaring said differences to produce squares, totalizing said squares to produce totals, determining a smallest total of the totals produced, and determining error probabilities of said convolutional codes on the basis of said smallest total to thereby estimate the channel conditions.

32. A method in accordance with claim 31, wherein the received signal is a signal encoded by one of a plurality of convolutional encoders each having a particular convolution code rate, and wherein step (a) is executed with the received signal at rates corresponding to said plurality of convolutional encoders in parallel to thereby determine which result is correct, whereby channel conditions are estimated.

33. A method in accordance with claim 32, wherein the received signal consists of a speech signal encoded to a convolutional code at a first code rate, and a control signal encoded to a convolutional code at a second code rate different from said first code rate, wherein the speech signal and the control signal are selectively located at a single position of a slot to be transmitted, and wherein step (a) comprises (e) executing trellis tracings at the first rate, and (f) executing trellis tracings at the second code rate, and wherein said method determines which of results of steps (e) and (f) is correct by estimating channel conditions to thereby identify the speech signal or the control signal.

34. A method in accordance with claim 31, wherein the received signal consists of a plurality of signals having respective bit rates and transformed to corresponding convolutional codes and then repeated to have a single symbol rate, wherein said method further comprises the step of (d) decoding the received signal to a plurality of coded data each having a particular rate by addition, and wherein step (a) comprises a plurality of parallel steps for respectively performing the trellis tracings in accordance with bit rates of said plurality of coded data, and wherein said method determines which of results of said plurality of parallel steps is correct to thereby identify the bit rate of the received signal.

35. A receiver for a coding communication and for identifying a code rate of a received signal encoded at any one of a plurality of code rates including a convolutional code rate, said receiver comprising:

a plurality of Viterbi decoding means for respectively performing trellis tracings with said received signal in accordance with the plurality of code rates to thereby decode said received signal to a plurality of signals each having a particular code rate;

an M break-off means for sequentially receiving a plurality of path metrics sequentially detected by said plurality of Viterbi decoding means during the trellis tracings, and sequentially breaking off the trellis tracings of, among said plurality of path metrics, unlikely paths to thereby detect M most probable paths over at least two of said plurality of Viterbi decoding means, where M is a natural number; and a decision means for executing a final decision with the path metrics of said M paths, and tracing back a path corresponding to a result of said final decision to thereby output decoded bits.

36. A receiver in accordance with claim 35, wherein said plurality of Viterbi decoding means each comprises:

an ACS means for sequentially determining branch metrics based on the received signal during the trellis tracing, sequentially adding said branch metrics to last branch metrics branch by branch, comparing resulting path metrics, and sequentially selecting one path smaller in path metric than the other path;

a metric storing means for sequentially updating the path metrics of the paths selected by said ACS means branch by branch, and feeding said path metrics to said ACS circuit; and a path storing means for sequentially updating survivor paths selected by said ACS means;

wherein said ACS means and said metric storing means are both connected to an input side of said M break-off means, wherein said path storing means is connected to an output side of said M break-off means, and wherein said M break-off means compares the path metrics received from the said ACS means of said plurality of Viterbi decoding means, causes, among said path metrics, likely path metrics to be sequentially written to the respective metric storing means, narrows down said paths to M paths by recursive path selection, causes said M paths to be written to the respective path storing means, and feeds path metrics of said M paths to said decision means; and wherein said decision means performs a decision on the received signal on the basis of the path metrics of survivor paths received via said M break-off means, reads the signal corresponding to a result of said decision out of the associated path storing means, and then outputs decoded bits resulting from traceback.

37. A receiver in accordance with claim 35, wherein when said M break-off means performs an M break-off over at least two of said plurality of Viterbi decoding means, said M break-off means causes one of said plurality of Viterbi decoding means lost a survivor path to end the trellis tracing while causing the other Viterbi decoding means having a survivor path to continue the trellis tracing.

38. A receiver in accordance with claim 35, wherein the received signal is a signal encoded by any one of a plurality of convolutional encoders each having a particular code rate, wherein said plurality of Viterbi decoding means each decodes the received signal at a respective rate corresponding to the code rate of one of said plurality of convolutional encoders, and wherein said decision means determines which of signals output from said plurality of Viterbi decoding means is correct, and then reproduces the correct signal.

39. A receiver in accordance with claim 35, wherein the received signal consists of a plurality of signals having respective bit rates and transformed to corresponding convolutional codes and then repeated to have a single symbol rate, wherein said device further comprises a plurality of rate restoring means for restoring a plurality of symbols each having a particular rate from the received signal, wherein said plurality of Viterbi decoding means are respectively connected to said plurality of rate restoring means and respectively perform the trellis tracings in accordance with symbol rates of said plurality of symbols to thereby decode the signals having the respective bit rates, wherein said receiver further comprises a voice decoder for decoding a speech in accordance with any one of the decoded signals, and wherein said voice decoder decodes the decoded data at one of the bit rates decoded by said plurality of Viterbi decoding means which is determined to be correct.

40. A receiver in accordance with claim 35, wherein the received signal includes a CRC (Cyclic Redundancy Check) code, and wherein said receiver further comprises checking means for performing error correction with the decoded signals by using the CRC code.

41. A receiver for a coding communication system and for identifying a code rate of a received signal encoded at any one of a plurality of code rates including a convolutional code rate, said device comprising:

a plurality of soft output Viterbi decoding means for respectively performing trellis tracings with the received signal in accordance with the plurality of code rates to thereby decode the received signal to a plurality of signals each having a particular rate, and for outputting together with said plurality of signals reliability information representative of likelihood of said plurality of signals;

a decision means for determining, based on said reliability information received from said plurality of soft output Viterbi decoding means, which of said plurality of signals is correct; and a selecting means for selecting one of said plurality of signals on the basis of a result of decision of said decision means.

42. A receiver in accordance with claim 41, wherein said plurality of soft output Viterbi decoding means each comprises:

an ACS means for sequentially determining branch metrics based on the received signal branch by branch during the trellis tracing, sequentially adding said branch metrics to last branch metrics, comparing resulting path metrics, and sequentially selecting one path smaller in path metric than the other path, and for sequentially outputting a difference between a greatest path metric and a smallest path metric branch by branch;

a metric storing means for sequentially updating the path metrics of the paths selected by said ACS means branch by branch, and feeding said path metrics to said ACS means; and a path storing means for sequentially updating survivor paths selected by said ACS means and reliability information based on a difference between path metrics of said paths and representative of likelihood of said paths;

wherein said path storing means includes a path updating means for producing, when the paths to be updated include a path different from previous paths, said reliability information based on the difference between the greatest branch metric and the smallest branch metric at each branch and output from said ACS means.

43. A receiver in accordance with claim 41, wherein the received signal is a signal encoded by any one of a plurality of convolutional encoders each having a particular code rate, wherein said plurality of soft output Viterbi decoding means each decodes the received signal at a respective rate corresponding to the code rate of one of said plurality of convolutional encoders, and wherein said decision means determines which of signals output from said plurality of soft output Viterbi decoding means is correct, and then reproduces the correct signal.

44. A receiver in accordance with claim 41, wherein the received signal consists of a plurality of signals having respective bit rates and transformed to corresponding convolutional codes and then repeated to have a single symbol rate, wherein said device further comprises a plurality of rate restoring means for restoring a plurality of symbols each having a particular rate from the received signal, wherein said plurality of Viterbi decoding means are respectively connected to said plurality of rate restoring means and respectively perform the trellis tracings in accordance with symbol rates of said plurality of symbols to thereby decode the signals having the respective bit rates, wherein said receiver further comprises a voice decoder for decoding a speech in accordance with any one of the decoded signals, and wherein said voice decoder decodes the decoded data at one of the bit rates decoded by said plurality of Viterbi decoding means which is determined to be correct.

45. A receiver in accordance with claim 41, wherein the received signal includes a CRC (Cyclic Redundancy Check) code, and wherein said receiver further comprises checking means for performing error correction with the decoded signals by using the CRC code.

46. A receiver for a coding communication system and for identifying a code rate of a received signal encoded at any one of a plurality of code rates including a convolutional code rate and received on a channel, said device comprising:

a plurality of Viterbi decoding means for respectively performing trellis tracing with said received signal in accordance with a plurality of code rates to thereby decode said received signal to a plurality of signals each having a particular code rate;

a decision means for receiving path metrics of last states of paths surviving after the trellis tracings performed by said plurality of Viterbi decoding means, and estimating channel condition of the channel based on said path metrics to thereby determine which of said plurality of signals output from said plurality of Viterbi decoding means is correct; and a selecting means for selecting one of said plurality of signals on the basis of a result of decision of said decision means.

47. A receiver in accordance with claim 46, wherein said plurality of Viterbi decoding means each comprises:

an ACS means for sequentially determining, based on the received signal, branch metrics branch by branch during the trellis tracing, sequentially adding said branch metrics to last branch metrics, comparing resulting path metrics, and sequentially selecting one path smaller in path metric than the other path;

a metric storing means for sequentially storing the path metrics selected by said ACS means branch by branch, and sequentially feeding previous path metrics to said ACS means;

a path storing means for sequentially updating the paths selected by said ACS means; and a control means for tracing back a survivor path stored in said path storing means to thereby output decoded bits, and reading the path metric of the last stage of said survivor path out of said metric storing means.

48. A receiver in accordance with claim 46, wherein the received signal is a signal encoded by any one of a plurality of convolutional encoders each having a particular code rate, wherein said plurality of Viterbi decoding means each decodes the received signal at a respective rate corresponding to the code rate of one of said plurality of convolutional encoders, and wherein said decision means determines which of signals output from said plurality of Viterbi decoding means is correct, and then reproduces the correct signal.

49. A receiver in accordance with claim 46, wherein the received signal consists of a plurality of signals having respective bit rates and transformed to corresponding convolutional codes and then repeated to have a single symbol rate, wherein said device further comprises a plurality of rate restoring means for restoring a plurality of symbols each having a particular rate from the received signal, wherein said plurality of Viterbi decoding means are respectively connected to said plurality of rate restoring means and respectively perform the trellis tracings in accordance with symbol rates of said plurality of symbols to thereby decode the signals having the respective bit rates, wherein said receiver further comprises a voice decoder for decoding a speech in accordance with any one of the decoded signals, and wherein said voice decoder decodes the decoded data at one of the bit rates decoded by said plurality of Viterbi decoding means which is determined to be correct.

50. A receiver in accordance with claim 46, wherein the received signal includes a CRC (Cyclic Redundancy Check) code, and wherein said receiver further comprises checking means for performing error correction with the decoded signals by using the CRC code.

51. A receiver for a coding communication system and for identifying a code rate of received signal encoded at any one of a plurality of code rates including a convolutional code rate and received on a channel, said device comprising:

a plurality of Viterbi decoding means for respectively performing trellis tracings with said received signal in accordance with the plurality of code rates to thereby decode said received signal to a plurality of signals each having a particular code rate;

a plurality of re-encoding means for respectively re-encoding said plurality of signals output from said plurality of Viterbi decoding means to corresponding convolutional codes;

a plurality of decision means for respectively performing signal decisions on the basis of said convolutional codes output from said plurality of re-encoding means and the said received signal; and a selecting means for selecting one of said plurality of signals output from said plurality of Viterbi decoding means on the basis of results of decisions of said plurality of decision means;

wherein said plurality of decision means respectively receive re-encoded symbol sequences from the respective re-encoding means and a received symbol sequence input to the respective Viterbi decoding means, multiply said re-encoded symbol sequences by a constant to produce products, produce differences between said products and the received symbol sequence, square said differences to produce squares, totalize said squares to produce totals, determine a smallest total of the totals produced, and estimate channel conditions of the channel based on said smallest total to thereby determine which of said plurality of signals output from said plurality of Viterbi decoding means is correct.

52. A receiver in accordance with claim 51, wherein the received signal is a signal encoded by any one of a plurality of convolutional encoders each having a particular code rate, wherein said plurality of Viterbi decoding means each decodes the received signal at a respective rate corresponding to the code rate of one of said plurality of convolutional encoders, and wherein said decision means determines which of signals output from said plurality of Viterbi decoding means is correct, and then reproduces the correct signal.

53. A receiver in accordance with claim 52, wherein the received signal consists of a speech signal transformed to a first convolutional code at a first code rate, and a control signal transformed to a second convolutional code at a second code rate different from said first code rate, wherein the first and second convolutional codes are selectively located at a same position of a slot, wherein said plurality of Viterbi decoding means include at least a first Viterbi decoding means for decoding the received signal at the first code rate, and a second Viterbi decoding means for decoding the received signal at the second code rate, wherein said plurality of decision means determine which of signals output from said first and second Viterbi decoding means is correct to thereby determine whether the received signal is the speech signal or the control signal, and wherein said receiver feeds the decoded bits to a voice decoder if the received signal is a speech signal or feeds said decoded bits to a control section if the received signal is a control signal.

54. A receiver in accordance with claim 52, wherein the received signal is a convolutional encoded signal modulated by a preselected time division modulation system, and wherein said receiver further comprises a demodulating means for demodulating said received signal.

55. A receiver in accordance with claim 51, wherein the received signal consists of a plurality of signals having respective bit rates and transformed to corresponding convolutional codes and then repeated to have a single symbol rate, wherein said device further comprises a plurality of rate restoring means for restoring a plurality of symbols each having a particular rate from the received signal, wherein said plurality of Viterbi decoding means are respectively connected to said plurality of rate restoring means and respectively perform the trellis tracings in accordance with symbol rates of said plurality of symbols to thereby decode the signals having the respective bit rates, wherein said receiver further comprises a voice decoder for decoding a speech in accordance with any one of the decoded signals, and wherein said voice decoder decodes the decoded data at one of the bit rates decoded by said plurality of Viterbi decoding means which is determined to be correct.

56. A receiver in accordance with claim 55, wherein the received signal is a convolutional encoded signal modulated by a preselected code division modulation system, and wherein said receiver further comprises a demodulating means for demodulating said received signal.

57. A receiver in accordance with claim 51, wherein the received signal includes a CRC code, and wherein said receiver further comprises checking means for performing error correction with the decoded signals by using the CRC code.

* * * * *